US008969989B2

(12) United States Patent
Yoneda et al.

(10) Patent No.: US 8,969,989 B2
(45) Date of Patent: Mar. 3, 2015

(54) OPTICAL-TO-ELECTRICAL CONVERTER UNIT AND SEMICONDUCTOR LIGHT-RECEIVING DEVICE

(71) Applicant: Sumitomo Electric Industries, Ltd., Osaka-shi, Osaka (JP)

(72) Inventors: Yoshihiro Yoneda, Isehara (JP); Ryuji Masuyama, Kamakura (JP); Hideki Yagi, Machida (JP); Naoko Inoue, Yokohama (JP)

(73) Assignee: Sumitomo Electric Industries, Ltd, Osaka (JP)

( * ) Notice: Subject to any disclaimer, the term of this patent is extended or adjusted under 35 U.S.C. 154(b) by 0 days.

(21) Appl. No.: 14/196,409

(22) Filed: Mar. 4, 2014

(65) Prior Publication Data

US 2014/0246746 A1    Sep. 4, 2014

(30) Foreign Application Priority Data

Mar. 4, 2013   (JP) ................................. 2013-041597

(51) Int. Cl.
*H01L 31/0232* (2014.01)

(52) U.S. Cl.
CPC ............................... *H01L 31/02327* (2013.01)
USPC ....................................................... 257/432

(58) Field of Classification Search
CPC .......................... H01L 31/105; H01L 31/02327
USPC ......................................... 257/432, E31.128
See application file for complete search history.

(56) References Cited

U.S. PATENT DOCUMENTS

| 5,608,565 A * | 3/1997 | Suzuki et al. ................. 359/237 |
| 2012/0153417 A1* | 6/2012 | Shi et al. ...................... 257/432 |

FOREIGN PATENT DOCUMENTS

JP    2007-180425    7/2007

* cited by examiner

*Primary Examiner* — Brook Kebede
(74) *Attorney, Agent, or Firm* — Smith, Gambrell & Russell LLP

(57) ABSTRACT

An optical-to-electrical converter unit includes a substrate having front and back surfaces; an original waveguide unit; and an optical-to-electrical converter. The optical-to-electrical converter includes a light-receiving element optically coupled to the optical waveguide unit; a capacitance element including first and second conductive layers and an insulating layer disposed between the first and second conductive layers; an electrode pad electrically connected to the light-receiving element; a back electrode formed on the back surface of the substrate; and a via electrode extending from the front surface to the back surface of the substrate. The optical waveguide unit, the light-receiving element, the capacitance element, and the electrode pad are formed on the front surface. The first conductive layer of the capacitance element is electrically connected to the light-receiving element and the electrode pad. The second conductive layer of the capacitance element is electrically connected to the back electrode through the via electrode.

8 Claims, 21 Drawing Sheets

OPTICAL-TO-ELECTRICAL CONVERTER UNIT AND SEMICONDUCTOR LIGHT-RECEIVING DEVICE

BACKGROUND OF THE INVENTION

1. Field of the Invention

The present invention relates to an optical-to-electrical converter unit and a semiconductor light-receiving device.

2. Description of the Related Art

In recent years, waveguide-type semiconductor light-receiving devices in which photodiodes and optical waveguides are integrated on semiconductor substrates have been studied. Such semiconductor light-receiving devices have high frequency characteristics which make them capable of responding to optical signals having high bit rates such as 40 Gb/s or higher, for example. Because of the high frequency characteristics, they are used as receiver front ends of optical transmission systems combining multi-level light intensity modulation systems and digital coherent receiving systems. The semiconductor light-receiving device is fabricated by forming, on a semiconductor substrate, a butt-joint structure including a stacked semiconductor layer section that constitutes a photodiode including an optical absorption layer and a stacked semiconductor layer section that constitutes an optical waveguide including a core layer.

Japanese Unexamined Patent Application Publication No. 2007-180425 (hereinafter referred to as '425 document) describes an optical semiconductor device. This optical semiconductor device includes a substrate in which a capacitor, a photodiode, and an electrode pad are arranged in particular regions. The capacitor and the electrode pad are arranged on the substrate so that the respective sides thereof are adjacent to each other with particular gaps therebetween.

SUMMARY OF THE INVENTION

The semiconductor light-receiving device in which a photodiode and an optical waveguide are integrated on a semiconductor substrate is sometimes equipped with a capacitor between a ground line (GND line or reference potential line) and a bias line that supplies a bias voltage to the photodiode. In order to reduce the size of the receiver front end, the capacitor is integrated on the semiconductor substrate together with the photodiode and the optical waveguide. A metal-insulator-metal (MIM) capacitor in which an insulating layer is sandwiched between two metal layers is preferably used as the capacitor to be integrated on the semiconductor substrate.

According to the optical semiconductor device described in '425 document, it is possible to increase the area of the capacitor and increase the capacitance without increasing the area of the entire semiconductor device. Thus, further size reduction and speed enhancement of the semiconductor light-receiving device are considered possible.

However, it has been found that if the operation frequency of a semiconductor light-receiving device in which a capacitor is integrated on a semiconductor substrate together with a photodiode and an optical waveguide is increased, the influence of the inductance component derived from line patterns, bonding wires, etc., on the resonance frequency of the circuit becomes more noticeable. For example, if there is a resonance frequency of the circuit in the band of the operation frequency of the semiconductor light-receiving device, it becomes difficult for the semiconductor light-receiving device to operate stably. Consequently, the operation frequency band of the semiconductor light-receiving device must be set within a range lower than the resonance frequency of the circuit. Accordingly, if the resonance frequency is relatively low, improvements of the operation frequency of the semiconductor light-receiving device is inhibited.

An optical-to-electrical converter unit according to a first aspect of the present invention includes a substrate having a front surface and a back surface; an optical waveguide unit; and one or more optical-to-electrical converters. The optical-to-electrical converter includes a light-receiving element including an optical absorption layer, a first electrode, and a second electrode, the light-receiving element being optically coupled to the optical waveguide unit; a capacitance element including a first conductive layer, a second conductive layer, and an insulating layer disposed between the first conductive layer and the second conductive layer; a first electrode pad electrically connected to the first electrode of the light-receiving element for supplying a bias voltage to the light-receiving element; a second electrode pad electrically connected to the second electrode of the light-receiving element; a back electrode formed on the back surface of the substrate, and a via electrode extending from the front surface to the back surface of the substrate, the via electrode connecting the capacitance element to the back electrode. The optical waveguide unit, the light-receiving element, the capacitance element, the first electrode pad, and the second electrode pad are formed on the front surface of the substrate. The first conductive layer of the capacitance element is electrically connected to the first electrode of the light-receiving element and the first electrode pad. In addition, the second conductive layer of the capacitance element is electrically connected to the back electrode through the via electrode.

In the optical-to-electrical converter unit, the capacitance element is formed on the front surface of the substrate. A via electrode that extends from the front surface to the back surface of the substrate is formed in the substrate. In addition, the second conductive layer of the capacitance element is electrically connected to the via electrode. Accordingly, a reference potential is given to the second conductive layer of the capacitance element through the via electrode. Compared with a structure in which a reference potential is given to the second conductive layer of the capacitance element through a bonding wire, this structure having the via electrode has a lower inductance component. Therefore, the resonance frequency of the circuit is increased for the optical-to-electrical converter unit. Accordingly, the operation frequency of the optical-to-electrical converter unit is increased.

In the optical-to-electrical converter unit according to the first aspect of the invention, the via electrode preferably includes a pillar extending in a thickness direction of the substrate. The via electrode fills a via hole penetrating through the substrate in the thickness direction with the pillar. In addition, the via electrode is integrated with the back electrode.

In the optical-to-electrical converter unit according to the first aspect of the invention, the substrate preferably includes a first region where the via electrode is formed and a second region where the light-receiving element and the optical waveguide unit are formed. The back electrode includes a first back electrode portion formed in the first region, and a second back electrode portion formed in the second region. The first back electrode portion is electrically connected to the via electrode. In addition, the first back electrode portion and the second back electrode portion are electrically isolated from each other.

For example, when a back electrode is formed on the entire back surface of the substrate and the light-receiving element and the optical waveguide include semiconductor layers of the same conductivity type formed on the front surface of the substrate, a parasitic capacitance is generated between the back electrode and the semiconductor layers. In this case, a transmission path of an electrical signal generated in the light-receiving element through the parasitic capacitance is formed, and a problem of cross talk arises between the light-receiving elements. In the optical-to-electrical converter unit described above, the back electrode includes a first back electrode portion formed in the first region and a second back electrode portion formed in the second region. In the first region of the substrate, the via electrode is formed, and in the second region of the substrate, the light-receiving element and the optical waveguide unit are formed. The first back electrode portion is electrically connected to the via electrode, and the first back electrode portion and the second back electrode portion are electrically isolated from each other. Accordingly, a parasitic capacitance generated between the back electrode and the semiconductor layers is reduced. Even when the light-receiving element and the optical waveguide unit include semiconductor layers of the same conductivity type formed on the front surface of the substrate, a transmission path of an electrical signal generated in the light-receiving element through the parasitic capacitance is not formed. Thus, the problem of cross talk among the light-receiving elements can be alleviated.

In the optical-to-electrical converter unit according to the first aspect of the invention, the first back electrode portion may be disposed at a first edge of the substrate. The second back electrode portion may be disposed at a second edge of the substrate opposite to the first edge of the substrate. In the optical-to-electrical converter unit, the second back electrode portion serves as a supporting portion that supports the light-receiving element and the optical waveguide when the optical-to-electrical converter unit is mounted on a mount board, for example.

In the optical-to-electrical converter unit according to the first aspect of the invention, the insulating layer of the capacitance element is preferably composed of a dielectric film including SiN film, SiON film, or $SiO_2$ film.

A semiconductor light-receiving device according to a second aspect of the invention includes a mount board having a ground layer; an optical-to-electrical converter unit disposed on the ground layer of the mount board; and a signal amplifier disposed on the ground layer of the mount board, the signal amplifier amplifying an electrical signal output from the optical-to-electrical converter. The optical-to-electrical converter unit includes a substrate having a front surface and a back surface; an optical waveguide unit; and an optical-to-electrical converter. In addition, the optical-to-electrical converter includes a light-receiving element including an optical absorption layer, a first electrode, and a second electrode, the light-receiving element being optically coupled to the optical waveguide unit; a capacitance element including a first conductive layer, a second conductive layer, and an insulating layer disposed between the first conducive layer and the second conductive layer; a first electrode pad electrically connected to the first electrode of the light-receiving element for supplying a bias voltage to the light-receiving element; a second electrode pad electrically connected to the second electrode, the second electrode pad being electrically connected to a signal input electrode pad of the signal amplifier; a back electrode disposed on the back surface of the substrate, back electrode being in contact with the ground layer of the mount board; and a via electrode extending from the front surface to the back surface of the substrate; the via electrode connecting the capacitance element to the back electrode. The optical waveguide unit, the light-receiving element, the capacitance element, the first electrode pad, and the second electrode pad are formed on the front surface of the substrate. The first conductive layer of the capacitance element is electrically connected to the first electrode of the light-receiving element and the first electrode pad. The second conductive layer of the capacitance element is electrically connected to the back electrode through the via electrode.

In the semiconductor light-receiving device according to the second aspect of the invention, preferably, the substrate includes a first region where the via electrode is formed and a second region where the light-receiving element and the optical waveguide unit are formed. The back electrode includes a first back electrode portion formed in the first region, and a second back electrode portion formed in the second region. The first back electrode portion is electrically connected to the via electrode. The first back electrode portion and the second back electrode portion are electrically isolated from each other. In addition, the second back electrode portion is electrically insulated from the ground layer of the mount board.

The semiconductor light-receiving device according to the second aspect of the invention preferably includes one or more of the optical-to-electrical converters in the optical-to-electrical converter unit; and one or more of the signal amplifiers. The signal amplifiers are adjacent to the optical-to-electrical converters in a waveguiding direction. According to this structure, the state of electrical connection between the optical-to-electrical converters and signal amplifiers is made uniform among channels each constituted by a pair of an optical-to-electrical converter and a signal amplifier. Accordingly, the output characteristics are made uniform among the channels.

DESCRIPTION OF THE PREFERRED EMBODIMENTS

Figure 1:
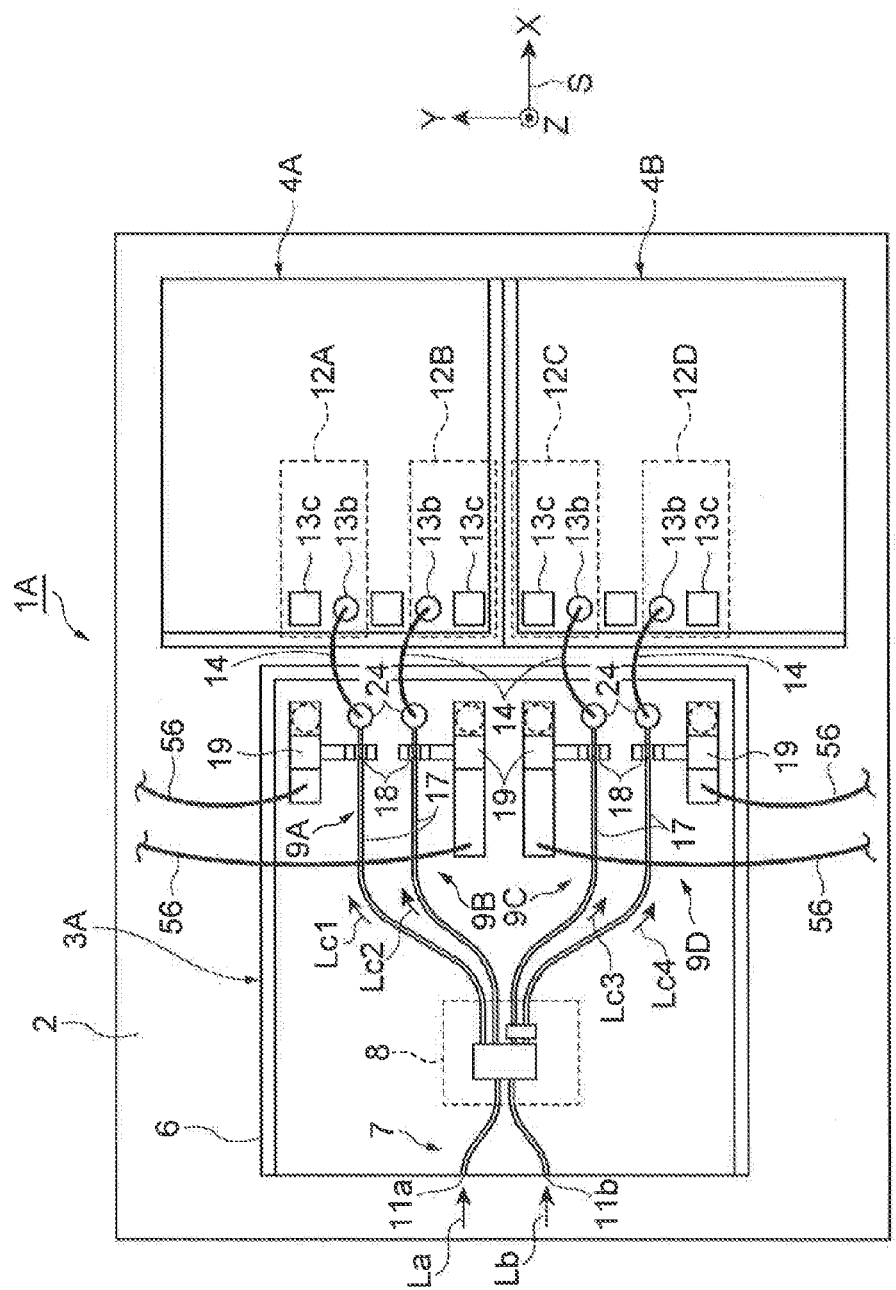
FIG. 1 is a plan view of a semiconductor light-receiving device according to a first embodiment.

Embodiments for carrying out the present invention will now be described in detail with reference to the attached drawings. In the description of the drawings, the same elements are represented by the same reference characters and the descriptions therefor are omitted to avoid redundancy.

First Embodiment

Figure 2:
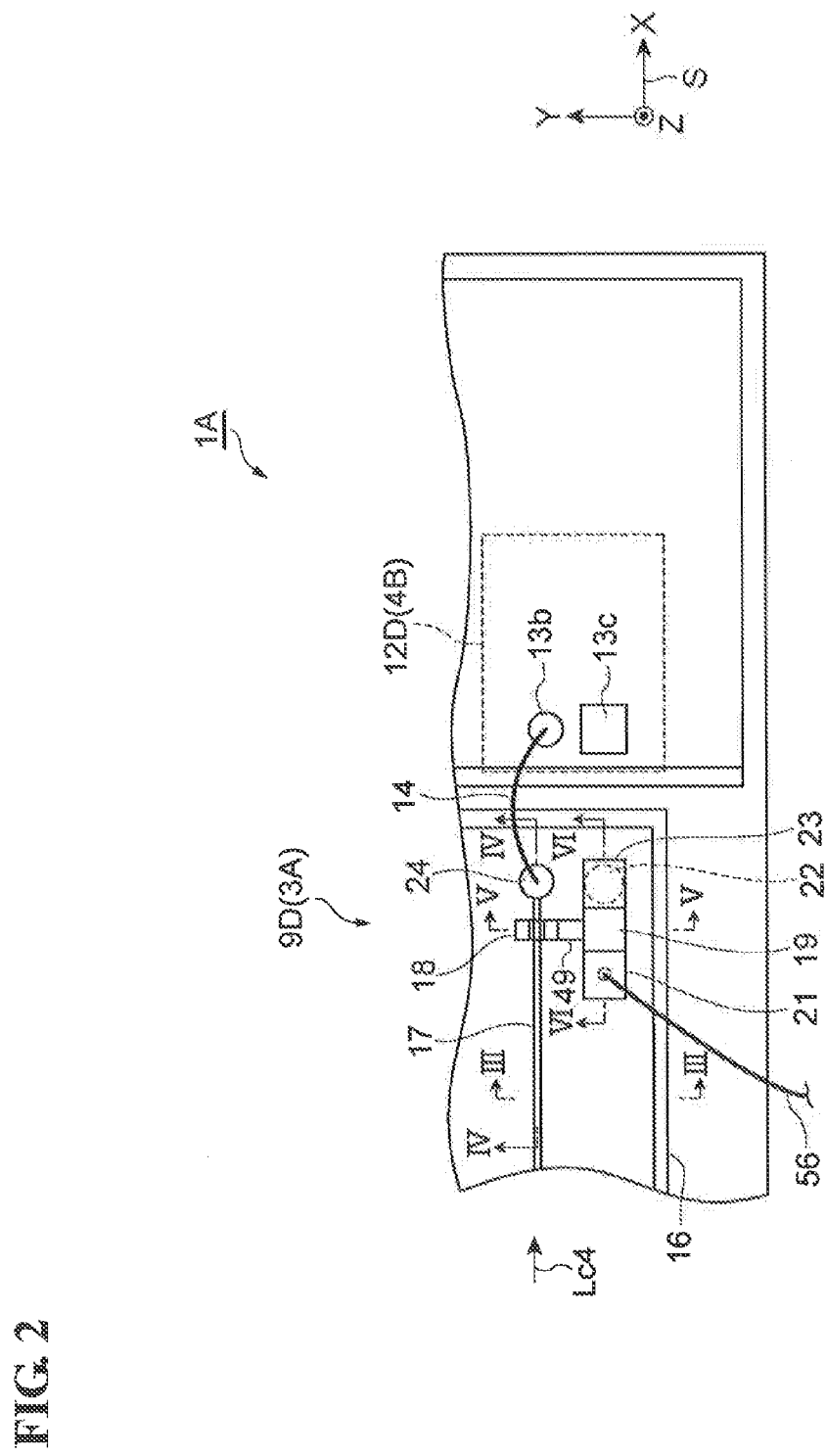
FIG. 2 is a partial enlarged view of the semiconductor light-receiving device according to the first embodiment.
Figure 3:
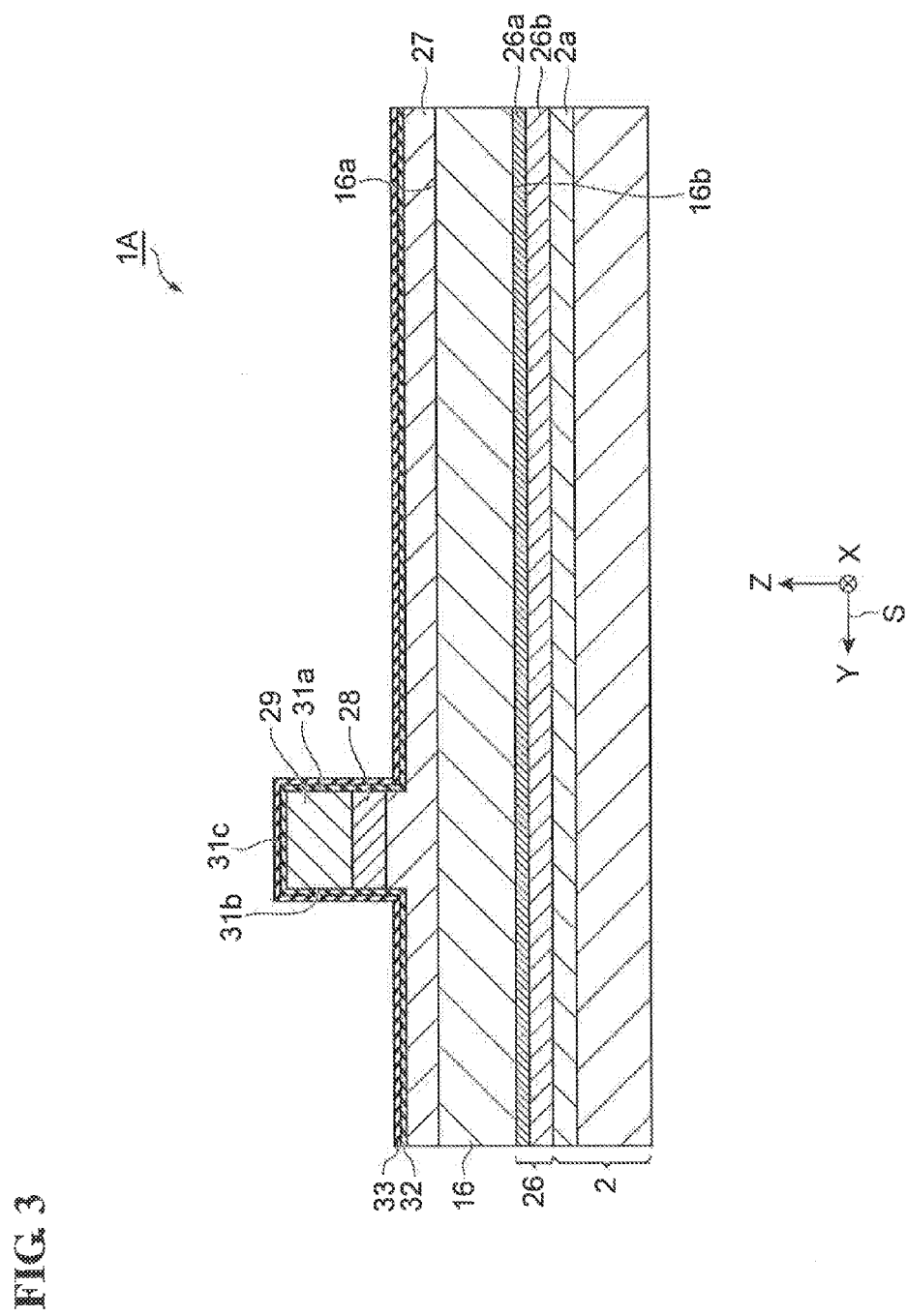
FIG. 3 is a cross-sectional view taken along line III-III in FIG. 2.
Figure 4:
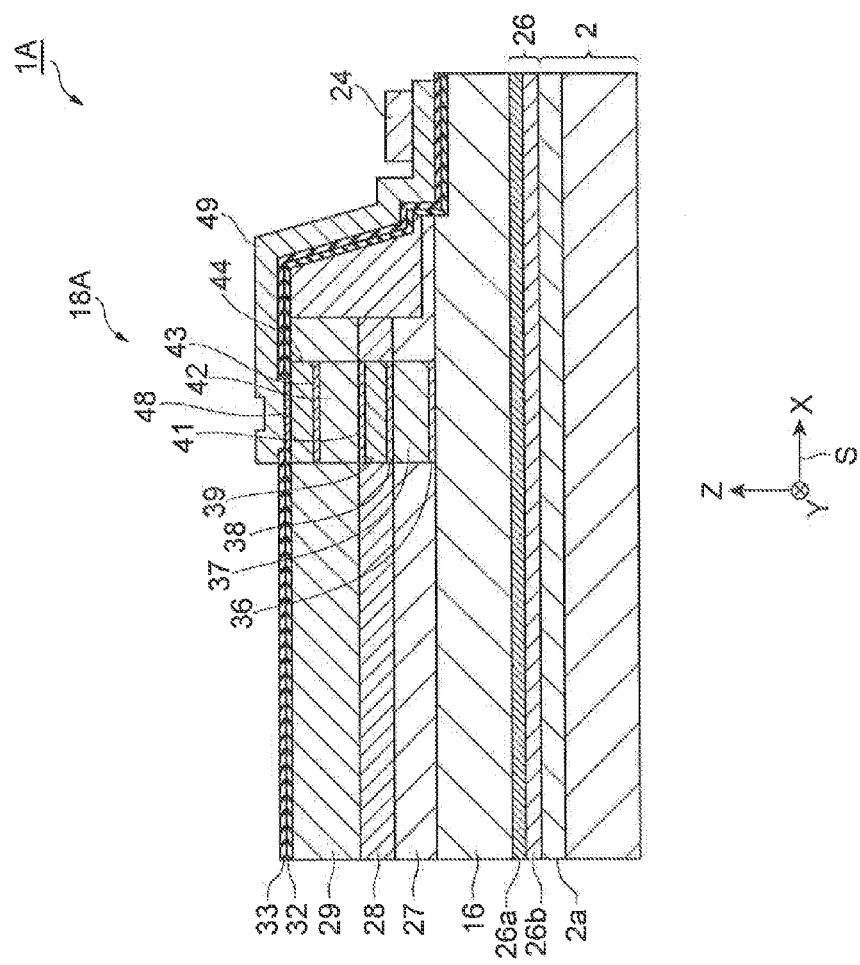
FIG. 4 is a cross-sectional view taken along line IV-IV in FIG. 2.
Figure 5:
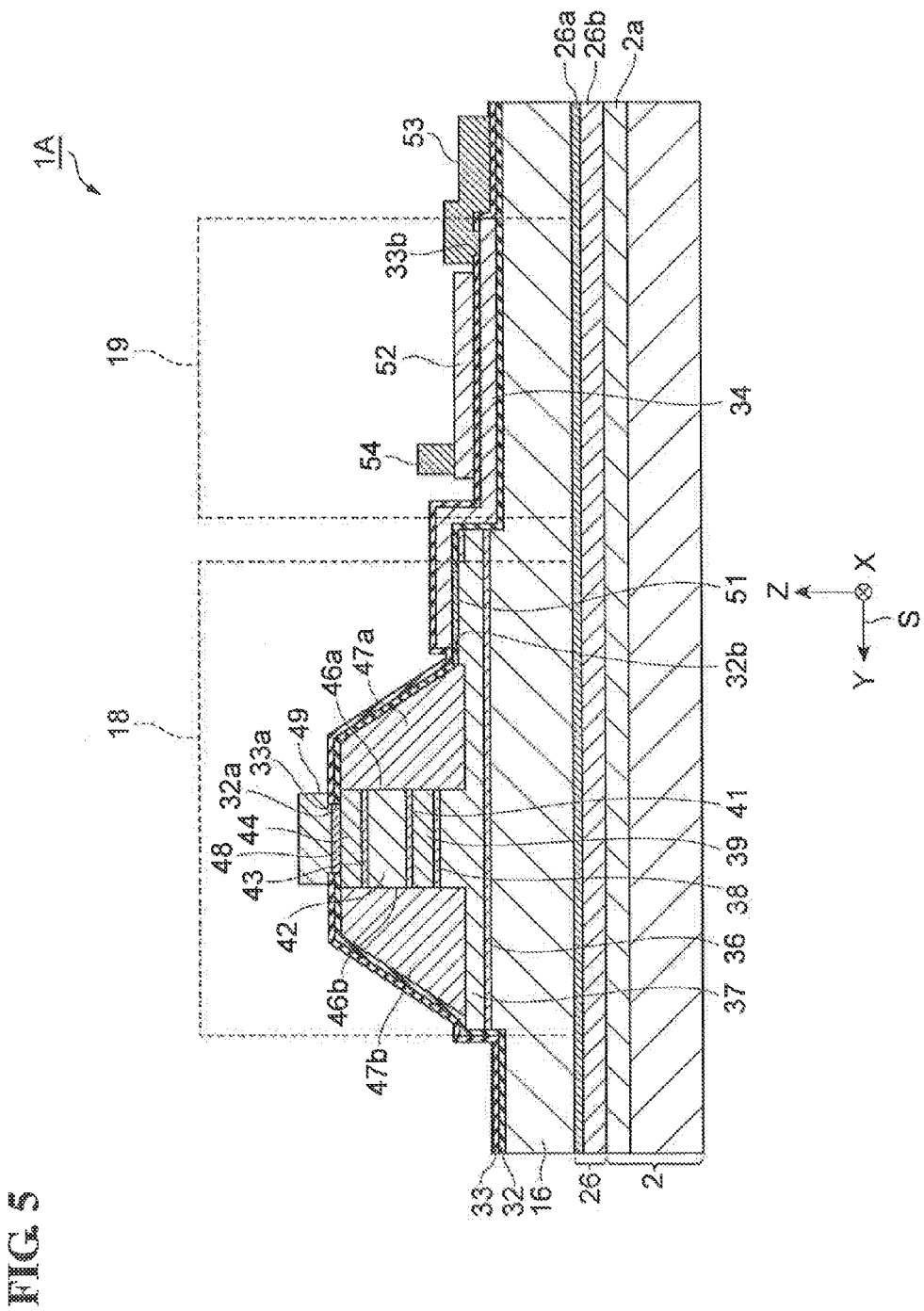
FIG. 5 is a cross-sectional view taken along line V-V in FIG. 2.
Figure 6:
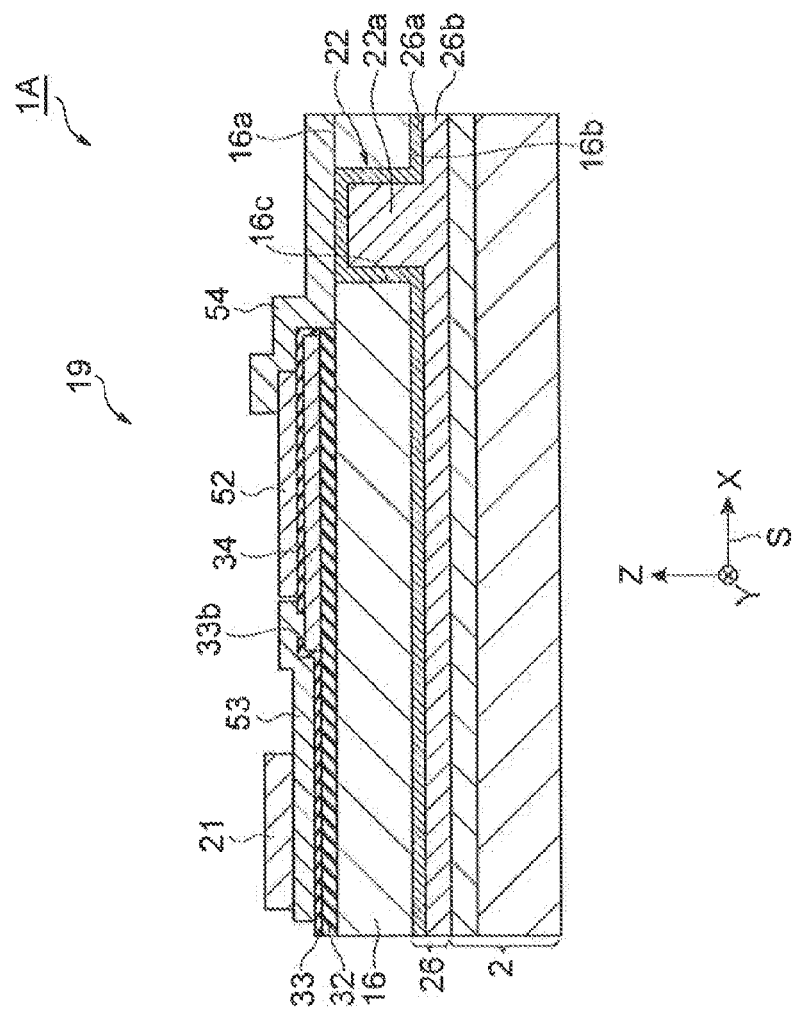
FIG. 6 is a cross-sectional view taken along line VI-VI in FIG. 2.
Figure 7:
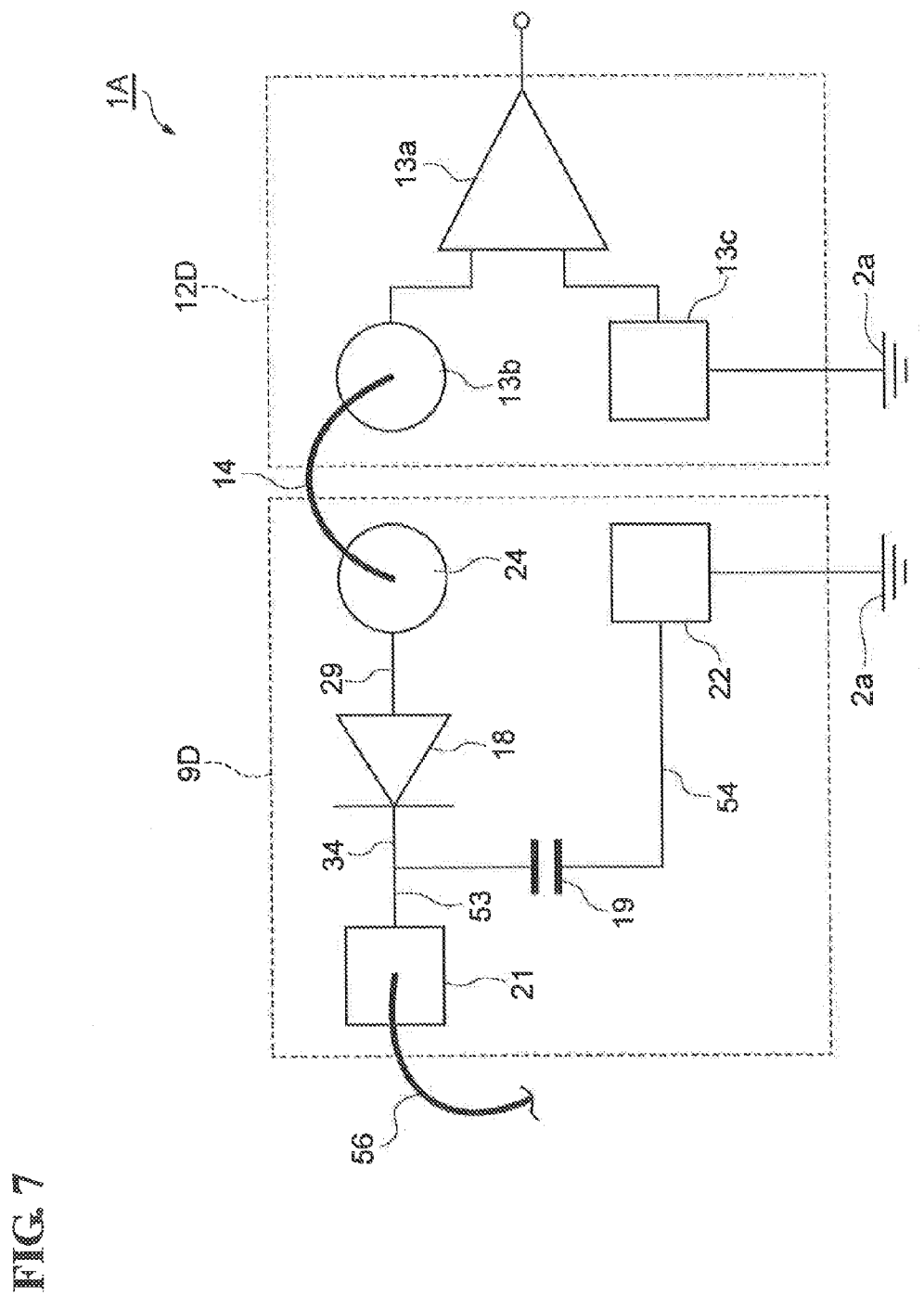
FIG. 7 is a circuit diagram showing electrical connections in the semiconductor light-receiving device according to the first embodiment.

An optical waveguide-type semiconductor light-receiving device (hereinafter may be simply referred to as "light-receiving device") according to a first embodiment is described with reference to FIGS. 1 to 7. FIG. 1 is a plan view of an optical waveguide-type semiconductor light-receiving device according to a first embodiment. FIG. 2 is a partial enlarged view of the semiconductor light-receiving device according to the first embodiment. FIG. 3 is a cross-sectional view taken along line III-III in FIG. 2. FIG. 4 is a cross-sectional view taken along line IV-IV in FIG. 2. FIG. 5 is a cross-sectional view taken along line V-V in FIG. 2. FIG. 6 is a cross-sectional view taken along line VI-VI in FIG. 2. FIG. 7 is a circuit diagram showing electrical connections in the semiconductor light-receiving device according to the first embodiment. For the sake of convenience, an orthogonal coordinate system S is included in each drawing.

In recent years, optical communication systems having high bit rates of 40 Gb/s or higher are being studied and developed to increase the transmission capacity of optical communication systems. In order to meet the rapid increase in network traffic, it is essential that the bit rate be further increased. A transmission system that combines a multi-level modulation technique and a digital coherent receiver technique is now being studied and developed as a communication system that realizes higher transmission capacity. The multi-level modulation technique features high frequency spectrum utilization efficiency and high dispersion tolerance during transmission. A prospective optical modulation technique that enables optical transmission of 100 Gb/s or faster is a quadrature phase-shift keying or QPSK. Since QPSK signals are transmitted on two polarizations, this technique is also called dual polarization quadrature phase shift keying (DP-QPSK) or polarization-multiplexed quadrature phase-shift-keying (PM-QPSK). In this description, the term D-QPSK is used to refer to dual polarizations and the term QPSK is used to refer to single polarization. For the multi-level modulation and coherent optical transmission, an optical demodulation circuit and a high-function high-performance receiver front end (FE) are necessary. The optical demodulation circuit performs a delayed treatment, branching, a phase-shift treatment, etc., on optical signals. The receiver front end (FE) includes a multi-channel balanced high-speed optical-to-electrical (O/E) converter. A light-receiving device 1A illustrated in FIGS. 1 to 7 is used as such a receiver front end.

As shown in FIG. 1, the light-receiving device 1A includes a mount board 2, an optical-to-electrical converter chip 3A, and signal amplifier chips 4A and 4B. The optical-to-electrical converter chip 3A changes a received optical signal to an electrical signal and outputs the electrical signal. The signal amplifier chips 4A and 4B amplify the electrical signals output from the optical-to-electrical converter chip 3A.

The mount board 2 is a component used to hybrid-integrate electrical parts such as the optical-to-electrical converter chip 3A and the signal amplifier chips 4A and 4B. Pads for mounting electronic components and patterns for electrical wiring not shown in the drawing are also formed on the mount board 2. A ground layer 2a (refer to FIG. 3) at a reference potential is also formed in the mount board 2. The ground layer 2a is formed by plating copper that is a base metal with nickel and/or gold.

The optical-to-electrical converter chip 3A is disposed on the mount board 2. The optical-to-electrical converter chip 3A includes a semiconductor substrate (substrate) 6, an input optical waveguide unit 7, an optical branch device 8, and a plurality (four in this case) of optical-to-electrical (O/E) converters 9A to 9D. The input optical waveguide unit 7, the optical branch device 8, and the O/E converters 9A to 9D are disposed on a surface of the semiconductor substrate 6. In the embodiment, the optical-to-electrical converter chip 3A corresponds to an optical-to-electrical converter unit.

The input optical waveguide unit 7 includes optical waveguides that guide light input to input ports 11a and 11b of the optical-to-electrical converter chip 3A up to the optical branch device 8. An optical signal La containing four signal components modulated by the QPSK technique is input to the input port 11a. Light Lb from a local oscillator is input to the input port 11b.

In the optical branch device 8, the optical signal La and the local oscillator light Lb interfere with each other. By using this interference, the optical branch device 8 branches the optical signal La into four signal components Lc1 to Lc4 modulated by the QPSK technique. The optical branch device 8 constitutes a so-called 90 degree optical hybrid by a multi-mode interference (MMI) coupler and is disposed on the surface of the semiconductor substrate 6. Of the four signal components Lc1 to Lc4, the signal components Lc1 and Lc2 are in the same polarization state and have an in-phase relationship. The signal components Lc3 and Lc4 are in the same polarization state that is different from the polarization state of the signal components Lc1 and Lc2. The signal components Lc3 and Lc4 have a quadrature relationship.

The signal components (optical signals) Lc1 to Lc4 output from the optical branch device 8 are input to the O/E converters 9A to 9D and electric signals corresponding to the signal components Lc1 to Lc4 are output from the O/E converters 9A to 9D. The four O/E converters 9A to 9D are aligned in the Y direction. The details of the O/E converters 9A to 9D are described later.

The signal amplifier chips 4A and 4B are adjacent to the optical-to-electrical converter chip 3A in the waveguiding direction (X direction) of the signal components Lc1 to Lc4 and are disposed on the surface of the mount board 2. The signal amplifier chip 4A includes two signal amplifiers 12A and 12B. The signal amplifier chip 4B includes two signal amplifiers 12C and 12D. In other words, the light-receiving device 1A includes four signal amplifiers 12A to 12D. The signal amplifier 12A is adjacent to the O/E converter 9A in the waveguiding direction (X direction) and is connected to the O/E converter 9A. The signal amplifier 12B is adjacent to the O/E converter 9B in the waveguiding direction (X direction) and is connected to the O/E converter 9B. The signal amplifier 12C is adjacent to the O/E converter 9C in the waveguiding direction (X direction) and is connected to the O/E converter 9C. The signal amplifier 12D is adjacent to the O/E converter 9D in the waveguiding direction (X direction) and is connected to the O/E converter 9D. As such, the signal amplifiers 12A to 12D of the signal amplifier chips 4A and 4B are electrically connected to the O/E converters 9A to 9D on a one-on-one basis. The signal amplifiers 12A to 12D have the same structure.

Referring to FIG. 7, the signal amplifier 12D is configured to amplify an electrical signal output from the O/E converter 9D. The signal amplifier 12D includes a transimpedance amplifier 13a configured to amplify electrical signals, a signal input electrode pad 13b, and a reference potential-side electrode pad 13c. The signal amplifier 12D performs differential amplification of electrical signals input to the signal input electrode pad 13b and generates one voltage signal. The signal input electrode pad 13b is electrically connected to the O/E converter 9D through a bonding wire 14 for inputting high-frequency signals. The signal amplifier 12D is electrically connected to the ground layer 2a of the mount board 2 through a bonding wire or a via electrode not shown in the drawing.

The O/E converters 9A to 9D will now be described in detail. Since the O/E converters 9A to 9D have the same structure, only the structure of the O/E converter 9D is described in detail and descriptions of the structures of the O/E converters 9A to 9C are omitted.

FIG. 2 is a partial enlarged view of the light-receiving device 1A. The O/E converter 9D and the signal amplifier 12D are illustrated in FIG. 2. As shown in FIG. 2, the O/E converter 9D includes a substrate 16, an optical waveguide 17, a light-receiving element 18, a capacitance element 19, a bias voltage-side electrode pad 21, a via electrode 22, a reference potential-side line 23, a signal output electrode pad 24, and a back electrode 26. In the embodiment, the bias voltage-side electrode pad 21 is a first electrode pad. The signal output electrode pad 24 is a second electrode pad. The O/E converters 9A to 9D each constitute an optical-to-electrical (O/E) converter unit.

The substrate 16 will now be described. The substrate 16 is a part of the semiconductor substrate 6. The substrate 16 is composed of, for example, semi-insulating InP such as Fe-doped InP. The substrate 16 has a back surface 16b that faces the mount board 2 and a front surface 16a on the opposite side of the back surface 16b. The optical waveguide 17, the light-receiving element 18, the capacitance element 19, the bias voltage-side electrode pad 21, the reference potential-side line 23, and the signal output electrode pad 24 are integrated on the front surface 16a of the substrate 16. The back electrode 26 is formed on the back surface 16b of the substrate 16 (refer to FIG. 6). A via hole 16c extending from the front surface 16a to the back surface 16b is formed in the substrate 16.

The optical waveguide 17 will now be described. The optical waveguide 17 optically connects the optical branch device 8 (refer to FIG. 1) to the light-receiving element 18. The optical waveguide 17 guides the signal component Lc4 output from the optical branch device 8 and inputs the signal component Lc4 to the light-receiving element 18. The optical waveguide 17 is formed on the front surface 16a of the substrate 16. One end of the optical waveguide 17 is optically connected to the optical branch device 8 (refer to FIG. 1) and the other end is optically connected to the light-receiving element 18.

The structure of the optical waveguide 17 will now be described with reference to FIG. 3. FIG. 3 is a cross-sectional view showing a structure of the optical waveguide 17 taken at a plane (YZ plane) perpendicular to the waveguiding direction (X direction). As shown in FIG. 3, the optical waveguide 17 includes a buffer layer 27 disposed on the front surface 16a of the substrate 16, an optical waveguide core layer 28 on the buffer layer 27, and a cladding layer 29 on the optical waveguide core layer 28. The buffer layer 27 is composed of, for example, semi-insulating InP such as Fe-doped InP. The optical waveguide core layer 28 is composed of a material that has a refractive index higher than that of the buffer layer 27 and lattice-matches with the buffer layer 27 (for example, InGaAsP). In one example, the band-gap wavelength of InGaAsP constituting the optical waveguide core layer 28 is 1.05 μm. The cladding layer 29 is composed of a material that has a refractive index lower than that of the optical waveguide core layer 28 and lattice-matches with the optical waveguide core layer 28 (for example, undoped InP). A part of the buffer layer 27, the optical waveguide core layer 28, and the cladding layer 29 constitute a mesa structure extending in a particular waveguiding direction (X direction) and the mesa structure has a pair of side surfaces 31a and 31b. Because of this mesa structure, an optical signal propagates in the optical waveguide core layer 28 in the optical waveguide 17. The side surfaces 31a and 31b and a top surface 31c of this mesa structure are protected by being covered with two insulating layers 32 and 33. The insulating layers 32 and 33 are composed of, for example, a dielectric film such as SiN film, SiON film, or $SiO_2$ film.

The light-receiving element 18 will now be described. The light-receiving element 18 generates and outputs an electrical signal corresponding to the optical intensity of the signal component Lc4 guided from the optical branch device 8 (refer to FIG. 1). The light-receiving element 18 has a structure of a PIN photodiode, for example. As shown in FIG. 2, the light-receiving element 18 is optically coupled to the optical branch device 8 through the optical waveguide 17.

As shown in FIG. 7, an anode electrode of the light-receiving element 18 is electrically connected to the signal input electrode pad 13b of the signal amplifier 12D through the signal output electrode pad 24 and the bonding wire 14. A cathode electrode of the light-receiving element 18 is electrically connected to a lower metal layer 34 of the capacitance element 19 described below. The cathode electrode of the light-receiving element 18 is also electrically connected to the bias voltage-side electrode pad 21 through a line 53 connected to the lower metal layer 34. In the embodiment, the cathode electrode of the light-receiving element 18 is a first electrode of the light-receiving element. The anode electrode of the light-receiving element 18 is a second electrode of the light-receiving element.

Next, the structure of the light-receiving element 18 is described with reference to FIGS. 4 and 5. FIG. 4 shows a structure of the light-receiving element 18 at the plane (XZ plane) taken in the waveguiding direction (X direction). FIG. 5 shows a structure of the light-receiving element 18 at the plane (YZ plane) perpendicular to the waveguiding direction (X direction). As shown in FIG. 4, the light-receiving element 18 includes an etch stop layer 36, an n-type buffer layer 37, an n-type heterostructure barrier buffer layer 38, an optical absorption layer 39, an i- or p-type heterostructure barrier buffer layer 41, a p-type cladding layer 42, a p-type heterostructure barrier buffer layer 43, and a p-type contact layer 44 sequentially stacked on the substrate 16 in that order. The etch stop layer 36 is an etch stop layer used in an etching step for forming a butt-joint structure. The etch stop layer 36 is formed of, for example, undoped InGaAsP having a band-gap wavelength of 1.15 μm. The n-type buffer layer 37 is formed of, for example, Si-doped InP. The n-type heterostructure barrier buffer layer 38 is formed of, for example, Si-doped InGaAsP having a band-gap wavelength of 1.4 μm. The optical absorption layer 39 is formed of, for example, undoped InGaAs. The i- or p-type heterostructure barrier buffer layer 41 is formed of, for example, two layers of undoped or Zn-doped InGaAsP. The band-gap wavelengths of the two layers constituting the i- or p-type heterostructure barrier buffer layer 41 are, for example, 1.3 μm and 1.1 μm, respectively. The p-type cladding layer 42 is formed of, for example, Zn-doped InP. The p-type heterostructure barrier buffer layer 43 is formed of, for example, two layers of Zn-doped InGaAsP. The band-gap wavelengths of the two layers constituting the p-type heterostructure barrier buffer layer 43 are, for example, 1.1 μm and 1.3 μm, respectively. The p-type contact layer 44 is formed of, for example, Zn-doped InGaAs.

As shown in FIG. 5, a part of the n-type buffer layer 37, the n-type heterostructure barrier buffer layer 38, the optical absorption layer 39, the i- or p-type heterostructure barrier buffer layer 41, the p-type cladding layer 42, the p-type heterostructure barrier buffer layer 43, and the p-type contact layer 44 constitute a mesa structure extending in the waveguiding direction (X direction). The mesa structure has a pair of side surfaces 46a and 46b. The n-type heterostructure barrier buffer layer 38, the optical absorption layer 39, and the i- or p-type heterostructure barrier buffer layer 41 each has one end in the waveguiding direction (X direction) in contact with the optical waveguide core layer 28 of the optical waveguide 17 and are thereby optically coupled to the optical waveguide core layer 28 (butt-joint structure) (refer to FIG. 4). The side surfaces 46a and 46b of the mesa structure are embedded in buried regions 47a and 47b formed of a semi-insulating material such as Fe-doped InP.

The light-receiving element 18 further includes the insulating layers 32 and 33. The insulating layers 32 and 33 are identical to the insulating layers 32 and 33 formed on the side surfaces 31a and 31b and a top surface 31c of the mesa structure of the optical waveguide 17. The insulating layers 32 and 33 are formed over the top surface of the mesa structure and the buried regions 47a and 47b. The insulating layers 32 and 33 have openings 32a and 33a in the top surface of the mesa structure. The p-type contact layer 44 is exposed from the insulating layers 32 and 33 through the openings 32a and 33a. A p-type ohmic electrode (anode electrode) 48 in contact with a surface of the p-type contact layer 44 is disposed in the openings 32a and 33a. The p-type ohmic electrode 48 is formed of, for example, an alloy between the p-type contact layer 44 and AuZn or Pt. A p-electrode line 49 is disposed on the p-type ohmic electrode 48. The p-electrode line 49 extends in the waveguiding direction (X direction) and electrically connects the p-type ohmic electrode 48 to the signal output electrode pad 24 (refer to FIG. 4). The p-electrode line 49 has, for example, a stacked structure such as TiW/Au or Ti/Pt/Au. The signal output electrode pad 24 is formed of, for example, Au plating.

The insulating layer 32 also has another opening 32b on the n-type buffer layer 37 remote from the mesa structure of the light-receiving element 18 in the Y direction. The n-type buffer layer 37 is exposed from the insulating layer 32 through the opening 32b. An n-type ohmic electrode (cathode electrode) 51 in contact with a surface of the n-type buffer layer 37 is formed in the opening 32b. The n-type ohmic electrode 51 is formed of, for example, an alloy between the n-type buffer layer 37 and AuGe or AuGeNi. The lower metal layer (first conductive layer) 34 of the capacitance element 19 described bellow extends over the n-type ohmic electrode 51.

The capacitance element 19 will now be described. The capacitance element 19 is a bypass capacitor for stabilizing the bias voltage supplied to the light-receiving element 18 and removing noise components in the bias voltage. The capacitance element 19 is a metal-insulator-metal (MIM) capacitor. As shown in FIG. 7, the capacitance element 19 is electrically connected to the cathode electrode of the light-receiving element 18 through the lower metal layer 34. The capacitance element 19 is also electrically connected to the bias voltage-side electrode pad 21 through the line 53 and to the via electrode 22 through the line 54.

The structure of the capacitance element 19 will now be described. FIG. 5 shows a structure of the capacitance element 19 at a cross section (YZ plane) perpendicular to the waveguiding direction (X direction). FIG. 6 shows a structure of the capacitance element 19 at a cross section (XZ plane) taken in the waveguiding direction (X direction). The capacitance element 19 of each of the O/E converters 9A, 9b, and 9C has the same structure as the capacitance element 19 of the O/E converter 9D.

Referring to FIGS. 5 and 6, the capacitance element 19 includes the insulating layer 32, the lower metal layer (first conductive layer) 34, the insulating layer 33, and an upper metal layer (second conductive layer) 52 sequentially stacked on the substrate 16 in that order. The lower metal layer 34 and the upper metal layer 52 each have, for example, a metal stacked structure such as TiW/Au or Ti/Pt/Au. The insulating layers 32 and 33 are identical to the insulating layers 32 and 33 formed in the optical waveguide 17 and the light-receiving element 18. The insulating layers 32 and 33 are formed of, for example, an insulating silicon compound (SiN, SiON, or $SiO_2$). The capacitance element 19 has a so-called MIM structure in which the insulating layer 32 is sandwiched between the lower metal layer 34 and the upper metal layer 52. The upper metal layer 52 is connected to the line 54. The lower metal layer 34 also functions as an n-electrode line for electrically connecting the capacitance element 19 to the light-receiving element 18. Accordingly, the lower metal layer 34 extends between the capacitance element 19 and the light-receiving element 18 and has one end connected to the n-type ohmic electrode (cathode electrode) 51 of the light-receiving element 18.

As shown in FIG. 6, the upper metal layer 52 is smaller than the lower metal layer 34 in size. An opening 33b is formed in the insulating layer 33 and on a portion of the lower metal layer 34 not covered with the upper metal layer 52. The line 53 is disposed on the lower metal layer 34 exposed from the opening 33b. The line 53 extends in the waveguiding direction (X direction) and electrically connects the lower metal layer 34 to the bias voltage-side electrode pad 21. The line 54 is disposed on the upper metal layer 52. The line 54 extends in the waveguiding direction (X direction) and electrically connects the upper metal layer 52 to the via electrode 22. In other words, the capacitance element 19 includes the lower metal layer (first conductive layer) 34 electrically connected to the light-receiving element 18 and the bias voltage-side electrode pad 21, the upper metal layer (second conductive layer) 52 electrically connected to the via electrode 22, and the insulating layer 33 disposed between the lower metal layer 34 and the upper metal layer 52. The line 53 and the line 54 each have, for example, a stacked structure such as TiW/Au or Ti/Pt/Au.

The bias voltage-side electrode pad 21 will now be described. The bias voltage-side electrode pad 21 is a wire bonding pad for providing DC power source connection for inputting a bias voltage to be supplied to the light-receiving element 18. As shown in FIG. 2, the bias voltage-side electrode pad 21 is disposed on the front surface 16a of the substrate 16. The bias voltage-side electrode pad 21 is electrically connected to the lower metal layer 34 of the capacitance element 19 through the line 53 (refer to FIG. 6). One end of a bonding wire 56 is connected to the bias voltage-side electrode pad 21 (refer to FIG. 7). The other end of the bonding wire 56 is electrically connected to a power source (not shown) for supplying the bias voltage. The bias voltage-side electrode pad 21 is formed of, for example, Au plating.

The via electrode 22 will now be described. As shown in FIG. 6, the via electrode 22 provides the reference potential to the capacitance element 19. The via electrode 22 includes a plating pillar 22a extending in the thickness direction (Z direction) of the substrate 16. The via electrode 22 has a front surface 16a-side portion electrically connected to the line 54 and a back surface 16b-side portion integrated with the back electrode 26.

The structure of the via electrode 22 will now be described. FIG. 6 shows a structure of the via electrode 22 at a cross section (XZ plane) taken in the waveguiding direction (X direction). As shown in FIG. 6, the via electrode 22 is formed by filling a via hole 16c penetrating through the substrate 16 in the thickness direction (Z direction) with a conductive material and extends from the front surface 16a to the back surface 16b of the substrate 16. The via electrode 22 includes a base metal layer 26a and the plating pillar 22a. The base metal layer 26a is formed on the back surface 16b of the substrate 16, a side wall of the via hole 16c, and the back surface of the line 54. The base metal layer 26a has, for example, a stacked structure such as TiW/Au or Ti/Pt/Au and functions as a base metal for forming the plating pillar 22a. The plating pillar 22a is formed so as to fill the via hole 16c in which the base metal layer 26a is formed. The plating pillar 22a is formed of, for example, Au.

The signal output electrode pad 24 will now be described. The signal output electrode pad 24 is an electrode pad through which an electrical signal output from the light-receiving element 18 is output to the signal amplifier 12D through the bonding wire 14. As shown in FIG. 4, the signal output electrode pad 24 is electrically connected to the p-type ohmic electrode (anode electrode) 48 of the light-receiving element 18 through the p-electrode line 49. One end of the bonding wire 14 is connected to the signal output electrode pad 24. The signal output electrode pad 24 is formed of, for example, Au plating.

The back electrode 26 will now be described. The back electrode 26 provides a reference potential to the via electrode 22. The back electrode 26 is disposed on the entire back surface 16b of the substrate 16 and is electrically connected to the ground layer 2a of the mount board 2. FIG. 6 shows the structure of the back electrode 26 at a cross section (XZ plane) taken in the waveguiding direction (X direction). The back electrode 26 includes the base metal layer 26a and a plating layer 26b. The base metal layer 26a is shared with the via electrode 22, and has a stacked structure such as TiW/Au or Ti/Pt/Au. The plating layer 26b is integrated with the plating pillar 22a of the via electrode 22.

In the optical-to-electrical converter chip 3A of the light-receiving device 1A having the above-described structure, the MMI coupler (optical branch device) 8 and the waveguide-type light-receiving element 18 is monolithically integrated. The MMI coupler (optical branch device) 8 constitutes a 90 degree optical hybrid configured to cause interference between the light signal La and the local oscillator light Lb. The waveguide-type light-receiving elements 18 are disposed at end portions of the four optical waveguides 17 on the outgoing side of the MMI coupler (optical branch device) 8 and convert the optical signal La into electrical signals. In the optical-to-electrical converter chip 3A, the capacitance element 19 is monolithically integrated in the region where the n-type ohmic electrode 51 of each light-receiving element 18 is formed. According to this arrangement, the inductance component between the n-type ohmic electrode 51 of the light-receiving element 18 and the capacitance element 19 serving as a bypass capacitor can be designed to be uniform among the light-receiving elements 18. Moreover, the upper metal layer 52 of the capacitance element 19 is connected to the ground layer 2a by forming the plating pillar 22a in the via hole 16c in the substrate 16. Accordingly, bonding pads and bonding wires for ground connection are not provided in the O/E converters 9A to 9D.

In the signal amplifier chips 4A and 4B of the light-receiving device 1A having the above-described structure, the transimpedance amplifiers 13a are hybrid-integrated and disposed downstream of the light-receiving elements 18. The signal amplifier chips 4A and 4B are connected to the optical-to-electrical converter chip 3A so that the first and second high-frequency electrical signals from the light-receiving elements 18 in phase of each other are input to the signal amplifier chip 4A and the third and fourth high-frequency electrical signals from the light-receiving elements 18 in quadrature to each other are input to the signal amplifier chip 4B.

A method for producing the light-receiving device 1A will now be described with reference to FIGS. 8 to 12. FIGS. 8 to 12 are diagrams showing the steps for forming the via electrode 22 of the light-receiving device 1A. FIGS. 8 to 12 show a region 16r at a cross section (XZ plane) taken in the waveguiding direction (X direction). The region 16r is where the via electrode 22 is formed in the substrate 16. It should be noted that the mount board 2 and the signal amplifier chips 4A and 4B of the light-receiving device 1A can be produced by known methods. The optical waveguides 17, the light-receiving elements 18, the capacitance elements 19, the bias voltage-side electrode pads 21, the reference potential-side lines 23, and the signal output electrode pads 24 of the optical-to-electrical converter chip 3A can also be produced by known methods. Thus, the steps of forming the via electrode 22 in the O/E converter 9D are described in detail below.

The steps of forming the via electrode 22 are performed after a step of forming a structure made of semiconductor materials and insulating materials for the optical waveguide 17, the light-receiving element 18, and the capacitance element 19 and a step of forming the p-type ohmic electrode 48 and the n-type ohmic electrode 51 of the light-receiving element 18, and the upper metal layer 52 of the capacitance element 19. The steps of forming the via electrode 22 are performed at the same time as forming the bias voltage-side electrode pad 21, the reference potential-side line 23, the signal output electrode pad 24, and metal wiring patterns such as the lines 34, 53, and 54.

Opening Forming Step

Figure 8:
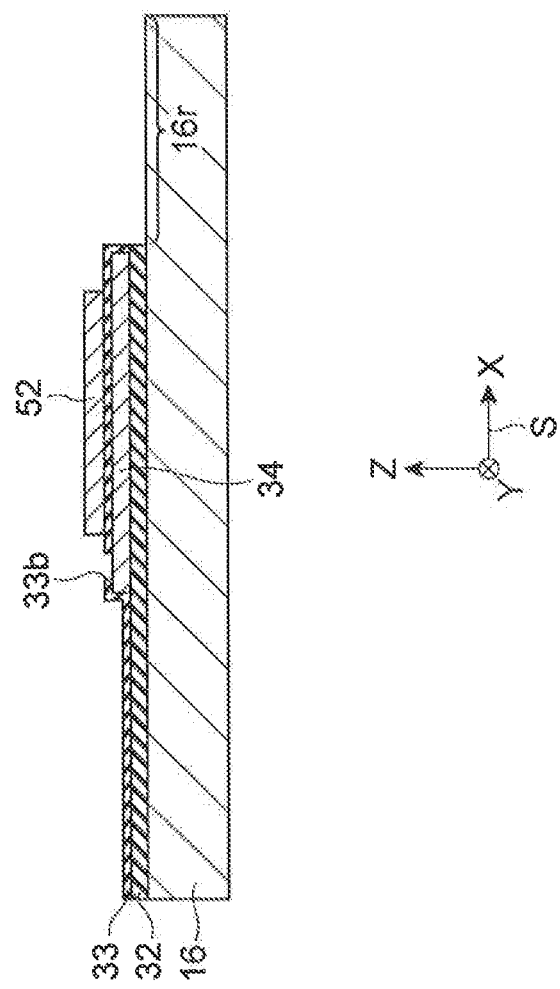
FIG. 8 is a diagram showing one of steps for forming a via electrode.

Referring to FIG. 8, the insulating layers 32 and 33 on the region 16r where the via electrode 22 is to be formed in the substrate 16 are removed to expose a surface of the region 16r. The opening 33b is formed in the insulating layer 33 so that the opening 33b is located on a portion of the lower metal layer 34 not covered with the upper metal layer 52. Removal of the insulating layer 32 and formation of the opening 33b are performed by, for example, an etching technique.

Line Forming Step

Figure 9:
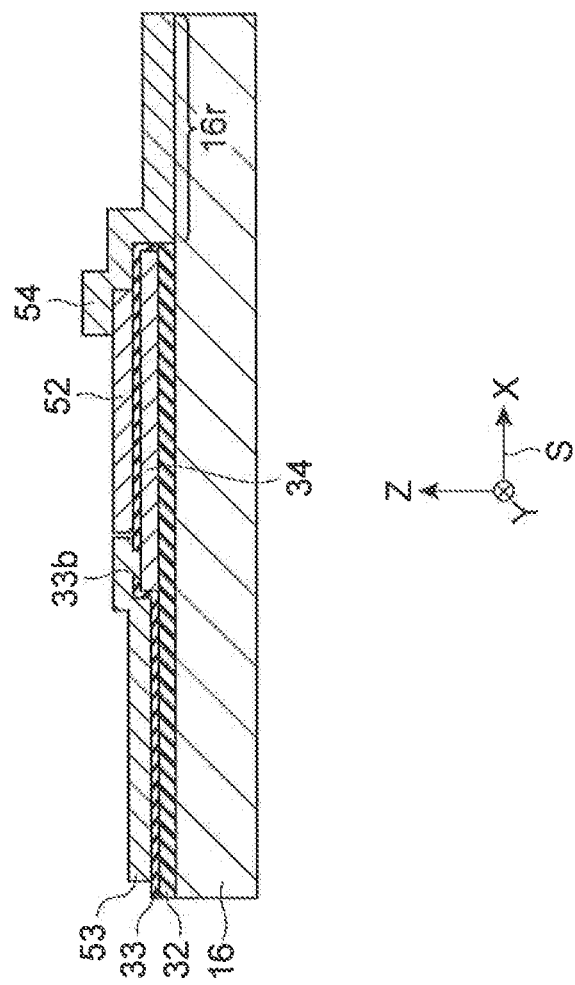
FIG. 9 is a diagram showing one of the steps for forming a via electrode.

Referring to FIG. 9, the line 53 is formed on the insulating layers 32 and 33 by a lift-off method so that the line 53 extends in the direction away from the signal amplifier chip 4B. The line 54 extending in the opposite direction to the line 53 is formed over the upper metal layer 52 and the region 16r of the substrate 16 by also using the lift-off method. The line 54 on the region 16r functions as a receiving pad line 54a in an etching step for forming the via hole 16c performed later. The p-electrode line 49 that extends in the same direction as the line 54 from the p-type ohmic electrode 48 of the light-receiving element 18 is then formed (refer to FIG. 4).

Electrode Pad Forming Step

Figure 10:
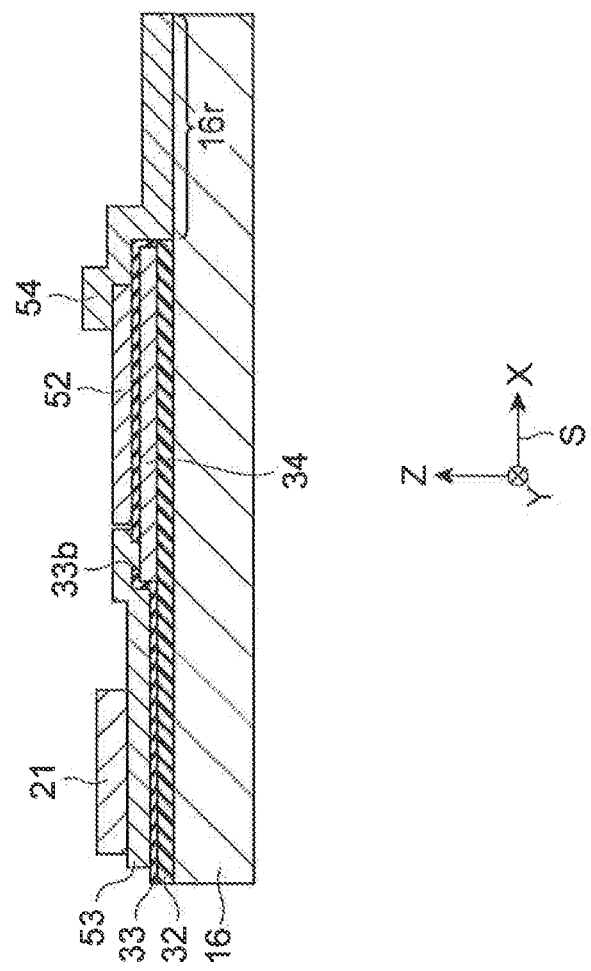
FIG. 10 is a diagram showing one of the steps for forming a via electrode.

As shown in FIG. 10, the bias voltage-side electrode pad 21 is formed on the line 53 by a plating technique. The signal output electrode pad 24 is formed on the p-electrode line 49 by a plating technique (refer to FIG. 4). No pad electrodes for receiving a bonding wire are formed on the region 16r.

Via Hole Forming Step

Figure 11:
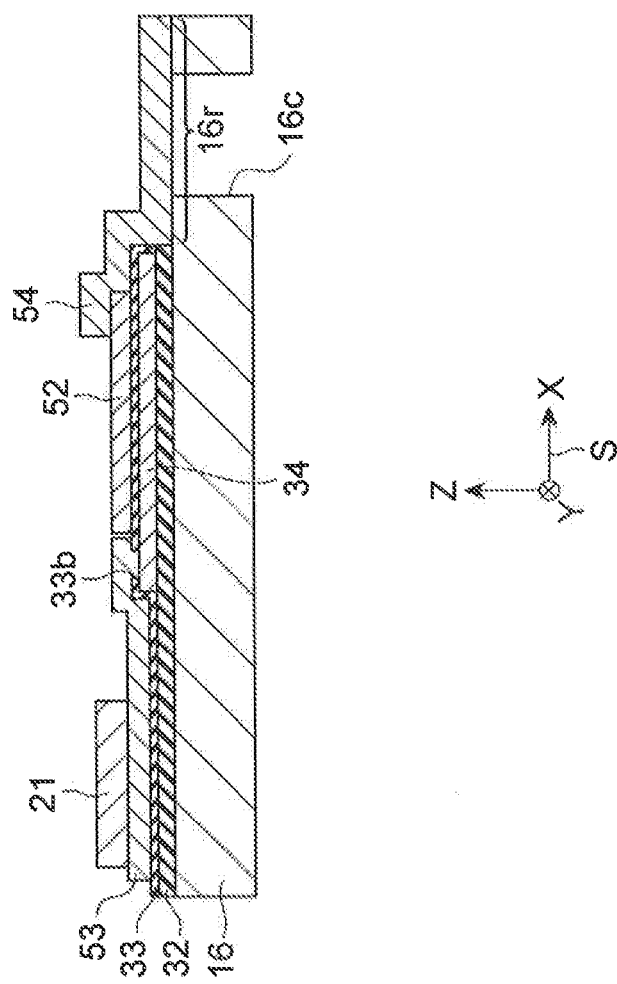
FIG. 11 is a diagram showing one of the steps for forming a via electrode.

As shown in FIG. 11, after an etching mask (not shown) is formed on the back surface 16b of the substrate 16, the substrate 16 exposed from the mask is etched to form the via hole 16c in the region 16r. As a result of the etching, the via hole 16c that exposes the line 54 on the back surface 16b of the substrate 16 is formed.

Via Electrode Forming Step

Figure 12:
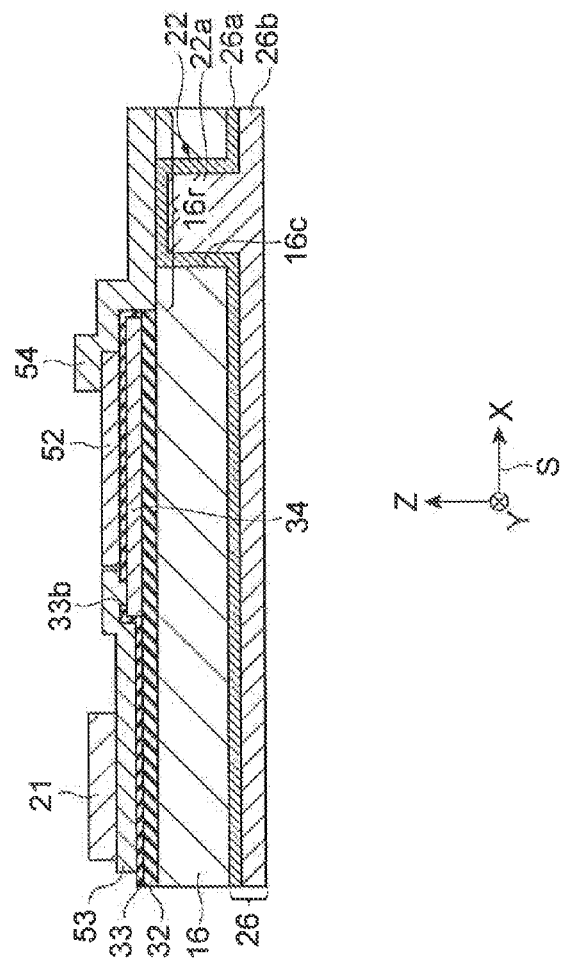
FIG. 12 is a diagram showing one of the steps for forming a via electrode.

As shown in FIG. 12, the base metal layer 26a for forming the plating pillar 22a and the plating layer 26b is formed. The base metal layer 26a is formed by a sputtering method over the back surface of the line 54 exposed from the via hole 16c, the side wall of the via hole 16c, and the back surface 16b of the substrate 16. Then the plating pillar 22a and the plating layer 26b of the back electrode 26 are formed on the base metal layer 26a by a plating method.

As a result of performing these steps, a light-receiving device 1A equipped with a via electrode 22 is produced.

Figure 21:
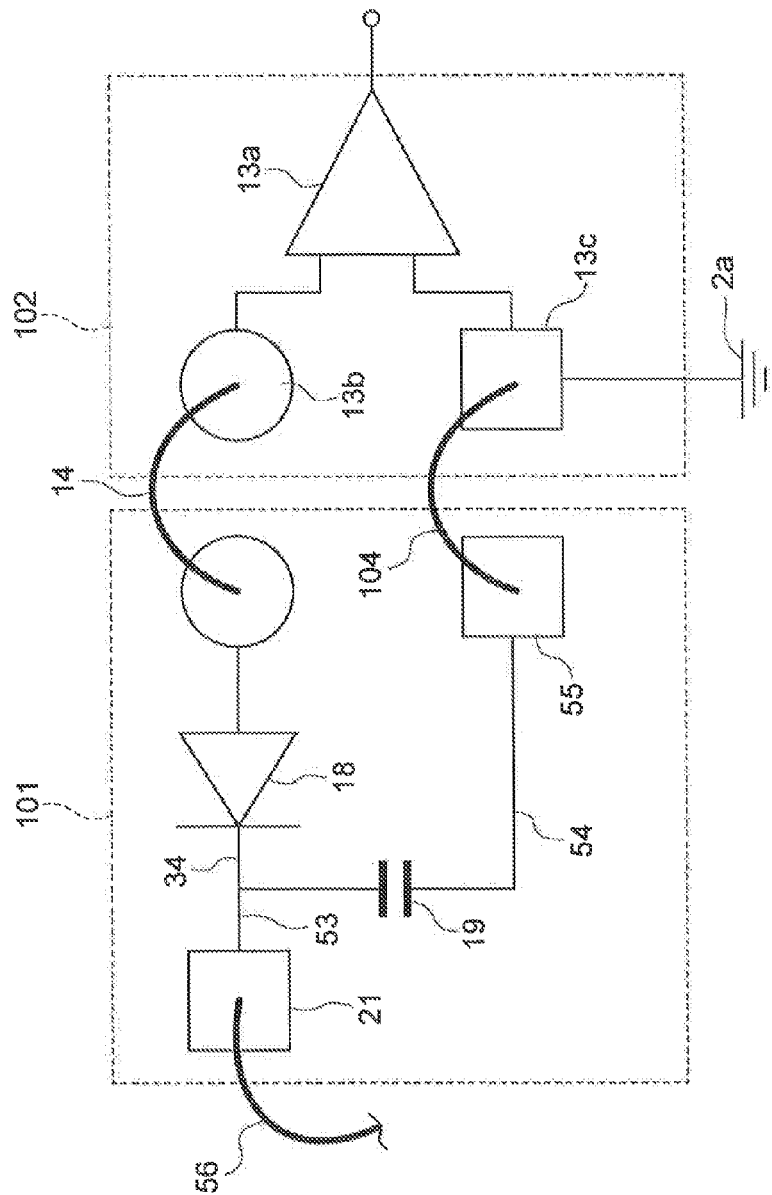
FIG. 21 is a circuit diagram showing electrical connections in a semiconductor light-receiving device according to Comparative Example.

A semiconductor light-receiving device according to a comparative example will now be described. FIG. 21 is a diagram illustrating electrical connections between a signal amplifier 102 and an optical-to-electric converter 101 in a light-receiving device 100. The light-receiving device 100 differs from the light-receiving device 1A of the embodiment in that the reference potential is given to the optical-to-electric converter 101 through the reference potential-side electrode pad 13c of the signal amplifier 102 and a bonding wire 104. In other words, two bonding wires 56 and 104 are electrically connected to the capacitance element 19. The optical-to-electric converter 101 also includes a reference potential-side electrode pad 55 for connecting with the bonding wire 104. The reference potential-side electrode pad 55 is formed on the line 54.

Experiments have found that the light-receiving device 100 having such a structure has a resonance frequency of about 22 GHz, for example. This resonance frequency is considered to be affected by the inductance components derived from the bonding wires 56 and 104 connected to the optical-to-electric converter 101 and the capacitance components derived from the lines 34, 53, and 54, the bias voltage-side electrode pad 21, and the reference potential-side electrode pad 55.

Difficulty does not arise as long as the resonance frequency is higher than the operation frequency of the light-receiving element 18. However, for a high-speed light-receiving element 18 operating at a bit rate of 40 Gbps or higher, the resonance frequency of the circuit lies within the operation frequency band (30 GHz or lower) of the light-receiving element 18. This makes it difficult to smoothly operate the O/E converters 9A to 9D. Accordingly, the resonance frequency must be shifted toward the higher frequency side. In order to shift the resonance frequency toward the higher frequency side, for example, the lengths of the bonding wires 56 and 104 may be decreased to decrease the inductance or the thickness of the substrate 16 may be increased to decrease the parasitic capacitance. However, decreasing the lengths of the bonding wires 56 and 104 makes bonding process difficult. Increasing the thickness of the substrate 16 makes it difficult to form individual chips from a wafer.

In contrast, the light-receiving device 1A has the via electrode 22 that extends from the front surface 16a to the back surface 16b of the substrate 16. The upper metal layer 52 of the capacitance element 19 formed on the front surface 16a of the substrate 16 is electrically connected to the via electrode 22. Accordingly, the reference potential is given to the upper metal layer 52 of the capacitance element 19 through the via electrode 22. According to this connecting structure, no bonding wires are necessary for ground connection. Moreover, the electrical connecting structure formed by the via electrode 22 decreases the inductance components compared to the connecting structure formed by bonding wires. Accordingly, the resonance frequency of the circuit including the capacitance element 19 is increased. Accordingly, the operation frequency of the light-receiving device 1A is increased.

In the light-receiving device 1A, the signal amplifiers 12A to 12D are adjacent to the O/E converters 9A to 9D in the waveguiding direction (X direction) of the optical signals. The electrical connections between the O/E converters 9A to 9D and the signal amplifiers 12A to 12D are established through channels each constituted by a pair of an O/E converter and a signal amplifier. Accordingly, the states of electrical connections between the O/E converters 9A to 9D and the signal amplifiers 12A to 12D in the light-receiving device 1A of the embodiment are made uniform among the respective channels. As a result, uniform output characteristics are achieved among the channels.

Second Embodiment

Figure 13:
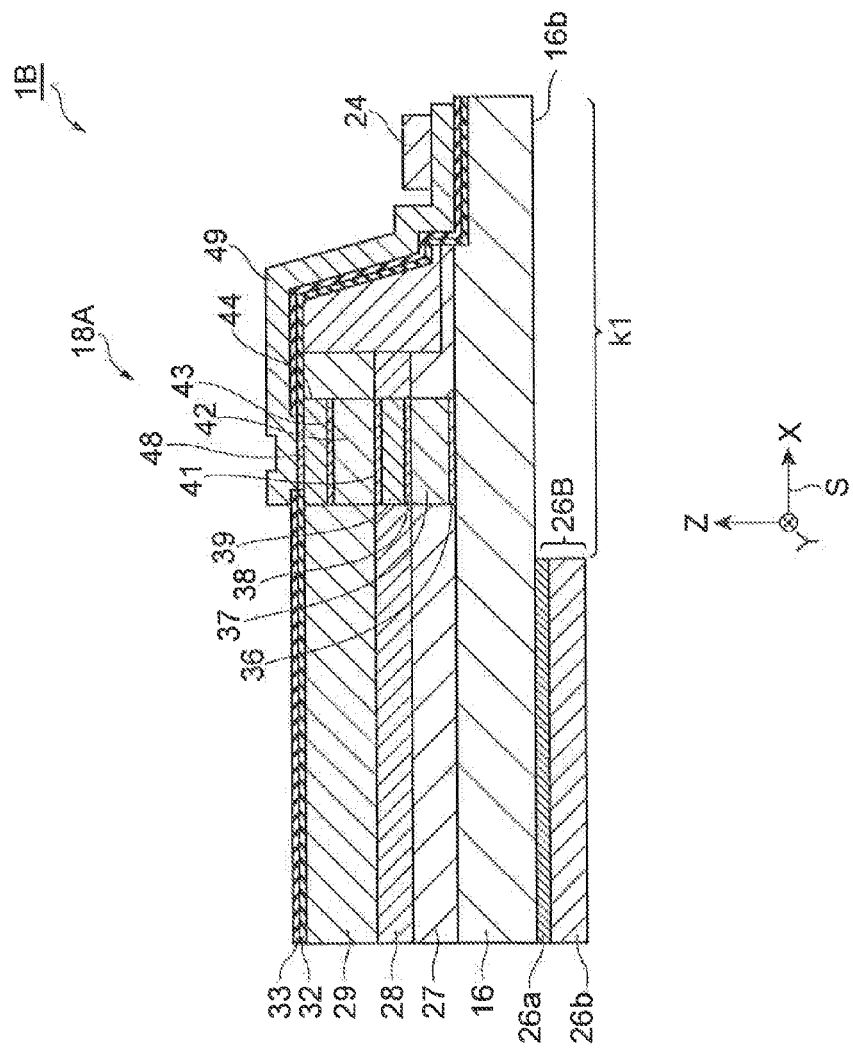
FIG. 13 is a cross-sectional view of a semiconductor light-receiving device according to a second embodiment.
Figure 14:
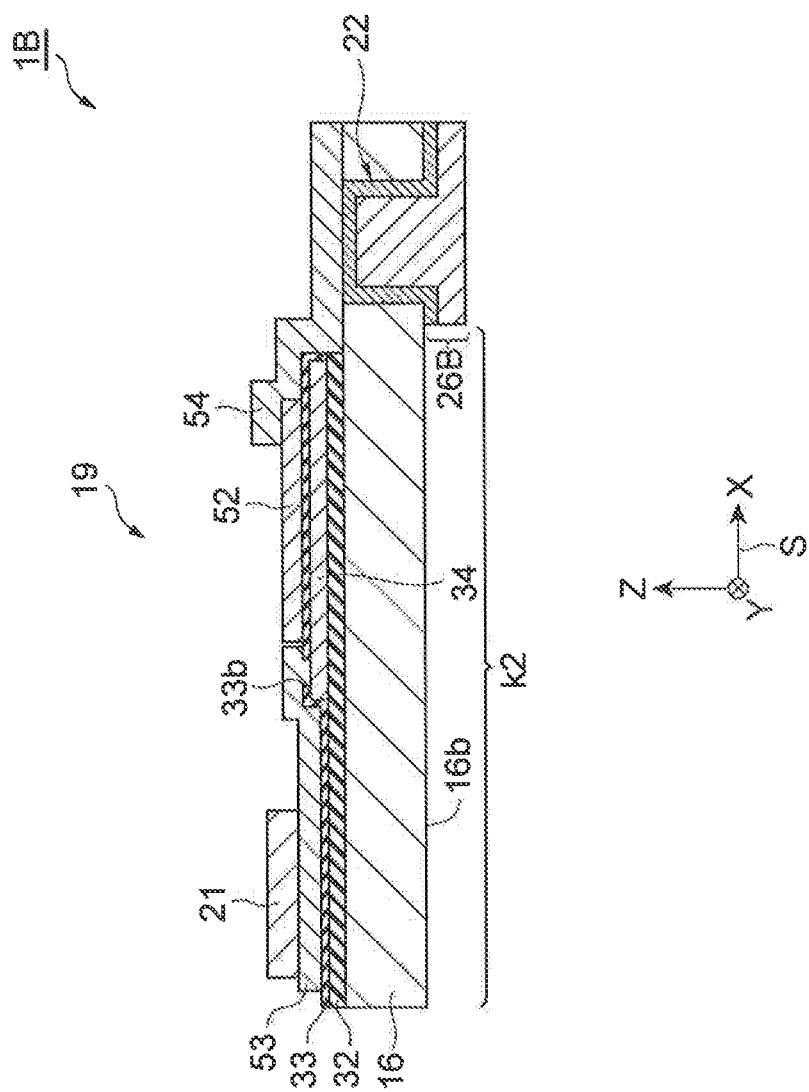
FIG. 14 is a cross-sectional view of the semiconductor light-receiving device according to the second embodiment.

An optical waveguide-type semiconductor light-receiving device 1B according to a second embodiment will now be described with reference to FIGS. 13 and 14. FIG. 13 is a cross-sectional view of the semiconductor light-receiving device 1B. The cross section (XZ plane) of the O/E converter 9D taken in the waveguiding direction (X direction) is shown in FIG. 13. FIG. 14 is a cross-sectional view of the semiconductor light-receiving device 1B. The cross section (YZ plane) of the O/E converter 9D perpendicular to the waveguiding direction (X direction) is shown in FIG. 14. The semiconductor light-receiving device 1B differs from the light-receiving device 1A in that it has a back electrode 26B having a structure different from that of the back electrode 26 of the light-receiving device 1A. In particular, the back electrode 26 of the light-receiving device 1A is formed over the entire back surface 16b of the substrate 16. In contrast, the back electrode 26B of the semiconductor light-receiving device 1B is not formed over the entire back surface 16b of the substrate 16 but formed by partly removing the back electrode 26. The back electrode 26 is partly removed by, for example, an ion milling method.

As shown in FIG. 13, the back electrode 26B of the semiconductor light-receiving device 1B is not formed on a region k1 facing the signal output electrode pad 24 and the p-electrode line 49 that connects the p-type ohmic electrode 48 to the signal output electrode pad 24. Accordingly, the back surface 16b of the substrate 16 is partly uncovered with the back electrode 26B. With this back electrode 26B, magnitude of the parasitic capacitance between the back electrode 26B and the p-electrode line 49 is decreased. Furthermore, magnitude of the parasitic capacitance between the back electrode 26B and the signal output electrode pad 24 is decreased.

Moreover, as shown in FIG. 14, the back electrode 26B is not formed on a region k2 that faces the capacitance element 19, the line 53, and the bias voltage-side electrode pad 21. Accordingly, the back surface 16b of the substrate 16 is partly uncovered with the back electrode 26B. With this back electrode 26B, magnitude of the parasitic capacitance between the back electrode 26B and the lower metal layer 34 is decreased and occurrence of parasitic capacitance between the back electrode 26B and the line 53 is suppressed. Moreover, magnitude of the parasitic capacitance generated between the back electrode 26B and the bias voltage-side electrode pad 21 is decreased.

The O/E converters 9A to 9D of the semiconductor light-receiving device 1B are each grounded through the via electrode 22. Thus, as with the light-receiving device 1A, the operation frequency is increased. In addition, magnitude of the parasitic capacitance is decreased in the semiconductor light-receiving device 1B. Thus, the resonance frequency of the circuit including the capacitance element 19 is further increased. The flexibility of designing the operation frequency of the semiconductor light-receiving device 1B is also enhanced.

Third Embodiment

Figure 15:
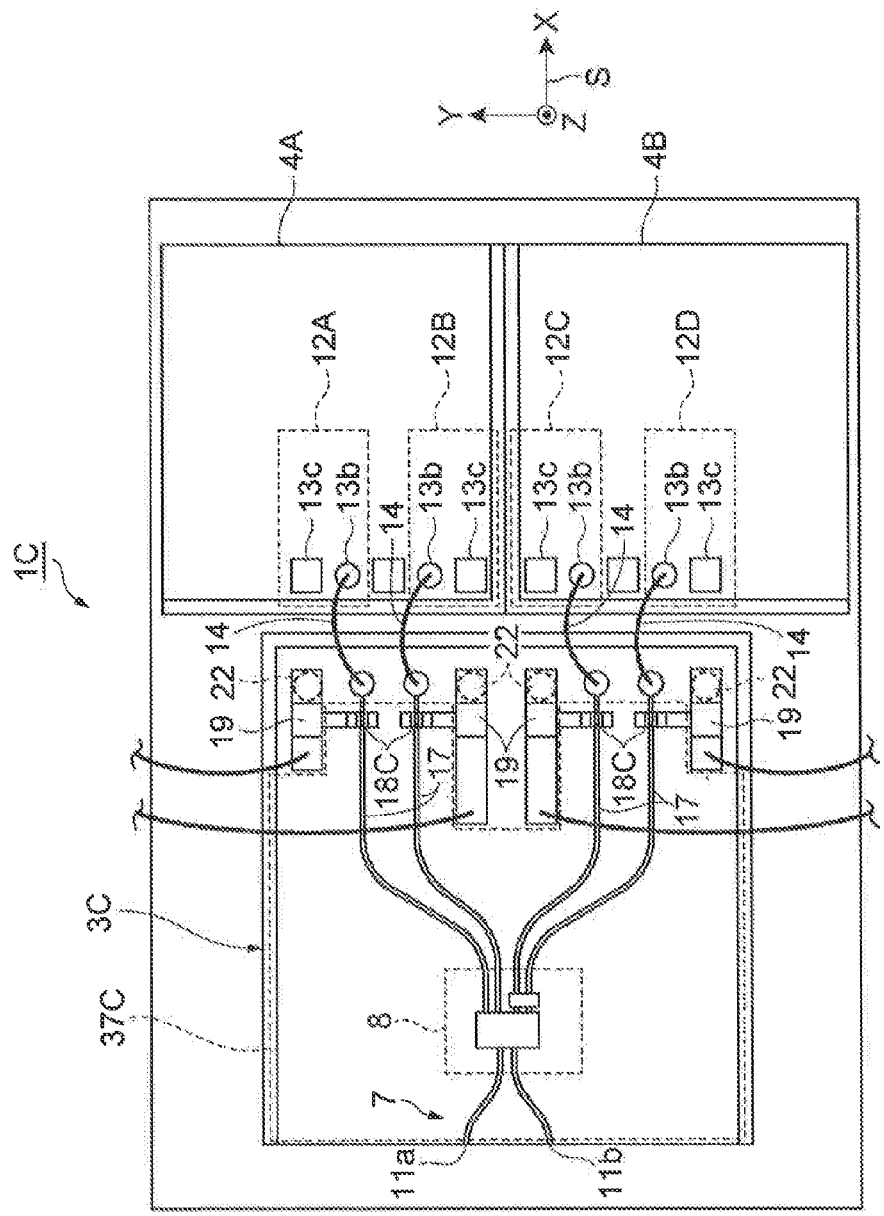
FIG. 15 is a plan view of a semiconductor light-receiving device according to a third embodiment.
Figure 16:
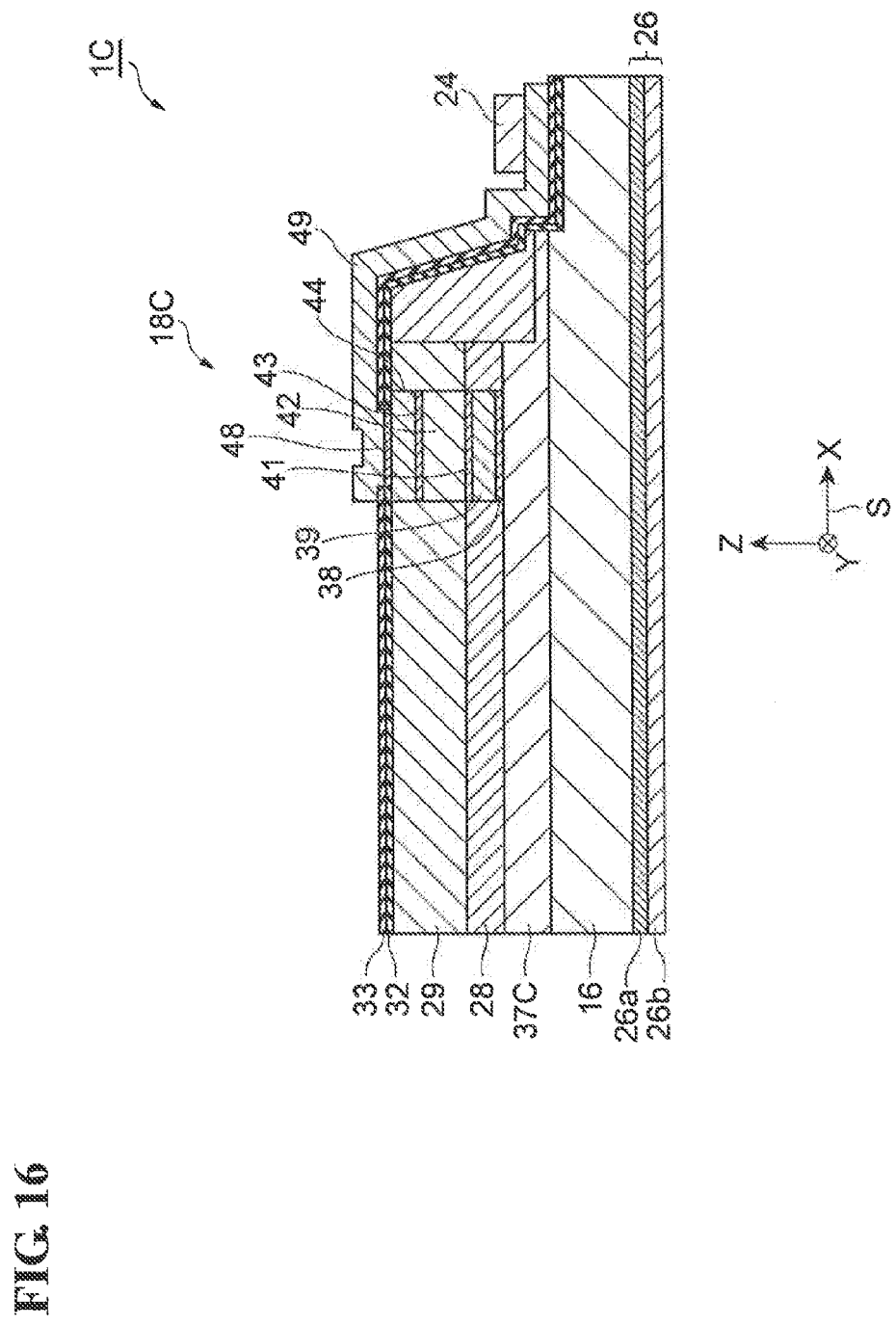
FIG. 16 is a cross-sectional view of the semiconductor light-receiving device according to the third embodiment.
Figure 17:
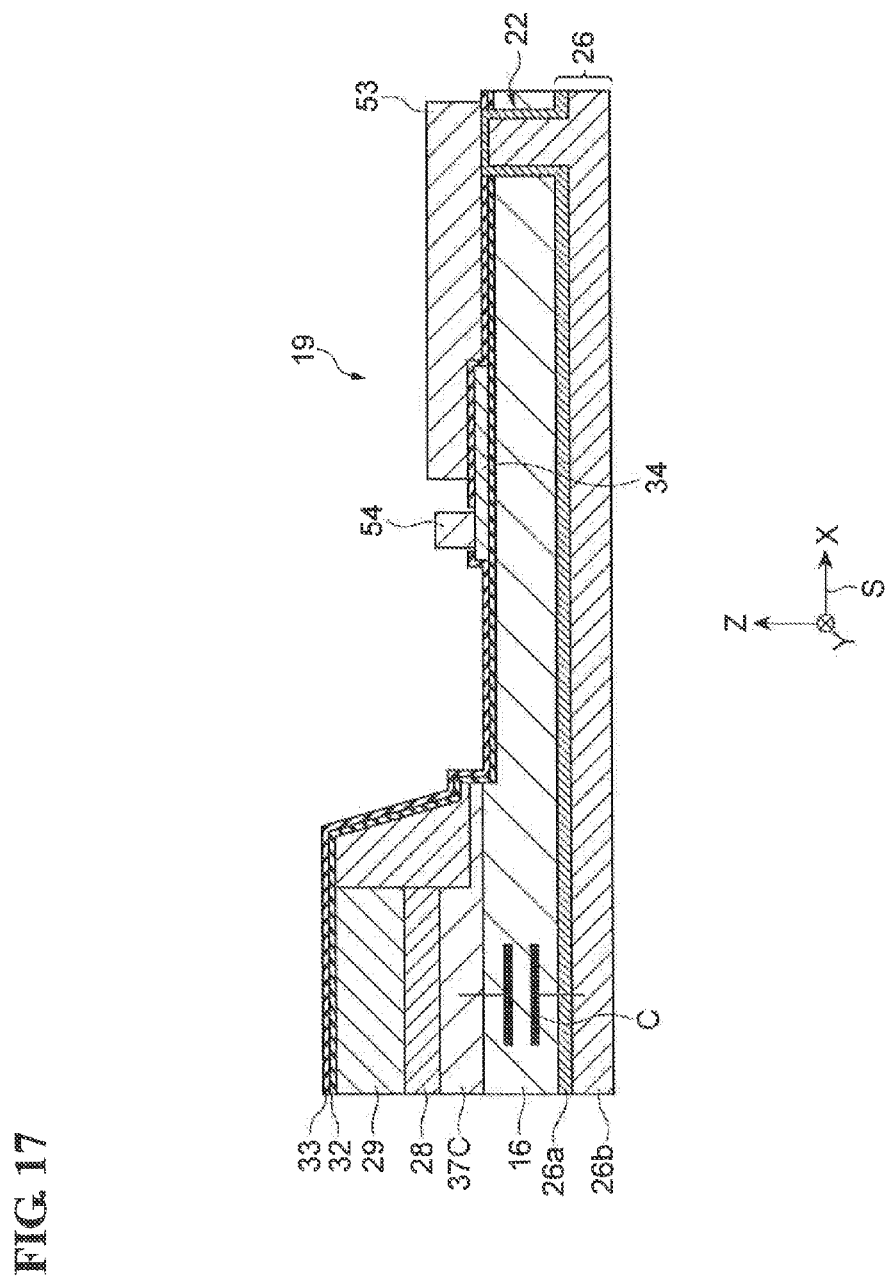
FIG. 17 is a diagram illustrating the effects of the semiconductor light-receiving device according to the third embodiment.
Figure 18:
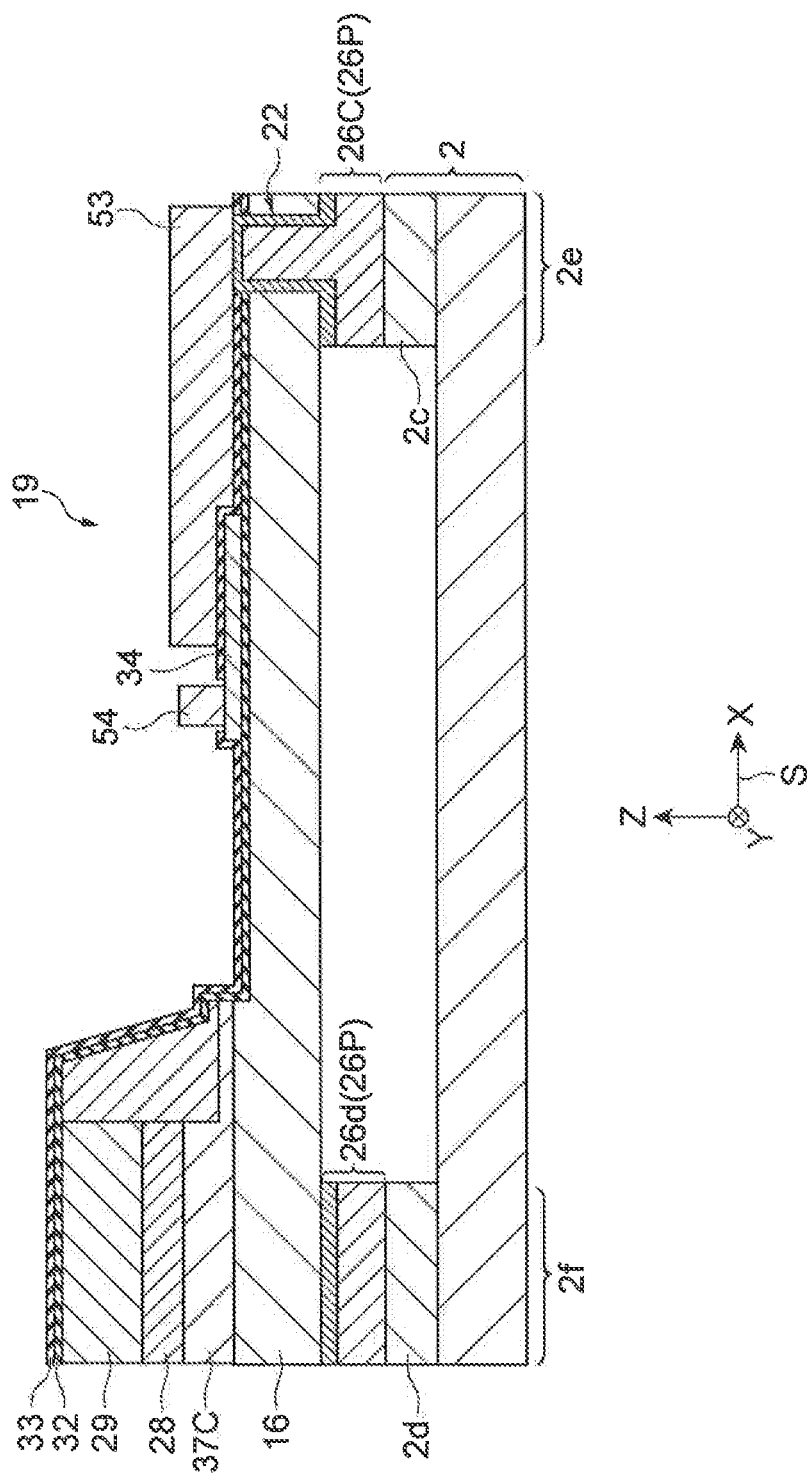
FIG. 18 is a diagram illustrating the effects of the semiconductor light-receiving device according to the third embodiment.

An optical waveguide-type semiconductor light-receiving device 1C according to a third embodiment will now be described with reference to FIGS. 15 to 18. FIG. 15 is a plan view of the optical waveguide-type semiconductor light-receiving device 1C according to the third embodiment. FIG. 16 is a cross-sectional view of the semiconductor light-receiving device 1C according to the third embodiment at a cross section (XZ plane) taken in the waveguiding direction (X direction). FIG. 17 is a diagram illustrating the effects of the semiconductor light-receiving device 1C. FIG. 18 is a diagram illustrating the effects of the semiconductor light-receiving device 1C. FIG. 18 is a cross-sectional view of the semiconductor light-receiving device 1C at another cross section (XZ plane) taken in the waveguiding direction (X direction).

In the light-receiving device 1A shown in FIG. 4, the n-type heterostructure barrier buffer layer 38, the optical absorption layer 39, the i- or p-type heterostructure barrier buffer layer 41, the p-type cladding layer 42, the p-type heterostructure barrier buffer layer 43, and the p-type contact layer 44 are formed on the n-type buffer layer 37. The n-type buffer layer 37 is embedded in the semi-insulating buffer layer 27. The optical waveguide core layer 28 is formed on the buffer layer 27.

In contrast, the semiconductor light-receiving device 1C shown in FIGS. 15 and 16 is different from the light-receiving device 1A in that the optical waveguide core layer 28 is formed on an n-type buffer layer 37C in addition to the n-type heterostructure barrier buffer layer 38, the optical absorption layer 39, the i- or p-type heterostructure barrier buffer layer 41, the p-type cladding layer 42, the p-type heterostructure barrier buffer layer 43, and the p-type contact layer 44. In other words, the n-type buffer layer 37C extends in a region where the optical waveguide core layer 28, the optical branch device 8, and the input optical waveguide unit 7 are formed (refer to FIG. 15). According to this structure, a step of growing a semi-insulating buffer layer 27 is unnecessary compared to the case of producing the light-receiving device 1A. Thus, the frequency of crystal growth is decreased. In the embodiment, the butt-joint structure is easily formed.

According to the structure shown in FIGS. 15, 16, and 18, the n-type buffer layer 37C also extends in the region where the optical waveguide core layer 28, the optical branch device 8, and the input optical waveguide unit 7 are formed. Accordingly, the opposing area between the n-type buffer layer 37C and a back electrode 26P in the semiconductor light-receiving device 1C is larger than the opposing area between the n-type buffer layer 37 and the back electrode 26 in the light-receiving device 1A. As a result, a parasitic capacitance C of about 12 pF may sometimes occur in the semiconductor light-receiving device 1C. The parasitic capacitance C is connected in parallel to the capacitance elements 19 of the O/E converters 9A to 9D through the n-type buffer layer 37C and the back electrode 26P. According to this structure, unintended paths through which electrical signals flow may be formed through the parasitic capacitance C.

When the semiconductor light-receiving device 1C operates in a receiving operation, a high-frequency electrical signal generated in the light-receiving element 18 is split to flow in the path formed by the capacitance element 19 and the path formed by the parasitic capacitance C. This results in voltage drop. The light-receiving elements 18 are connected to one another through the n-type buffer layer 37C and are also connected to the parasitic capacitance C. Thus, the voltage drop caused by the parasitic capacitance C also affects the individual light-receiving elements 18. This leads to a problem of cross-talk, namely, a phenomenon in which an output of a light-receiving element 18 is affected by outputs of other light-receiving elements 18.

Figure 19A:
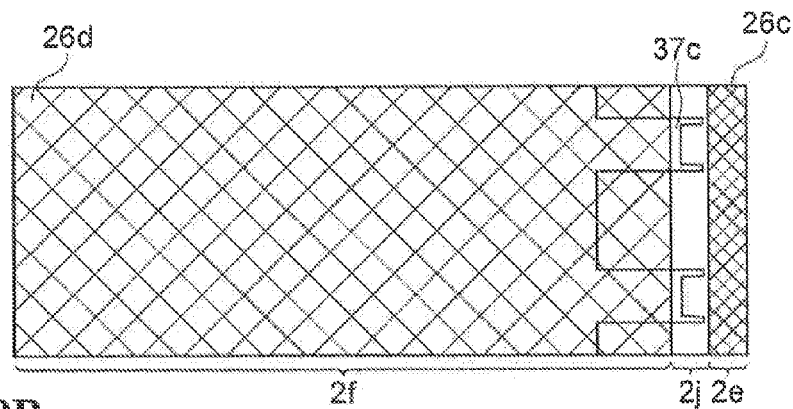
FIGS. 19A to 19C are diagrams showing modification examples of back electrodes.
Figure 19B:
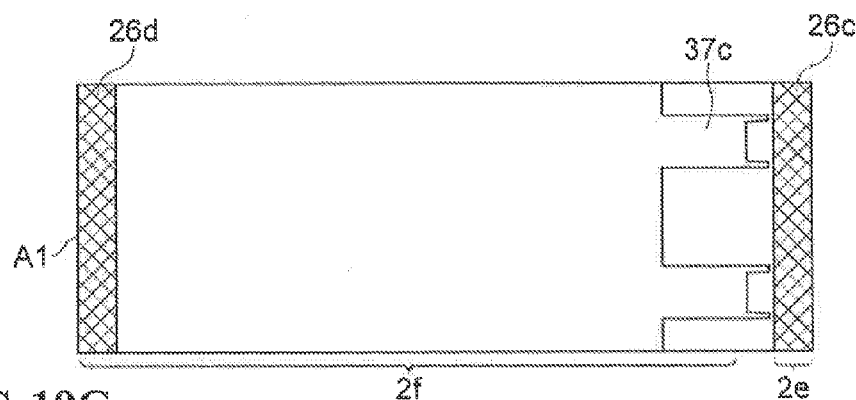
Figure 19C:
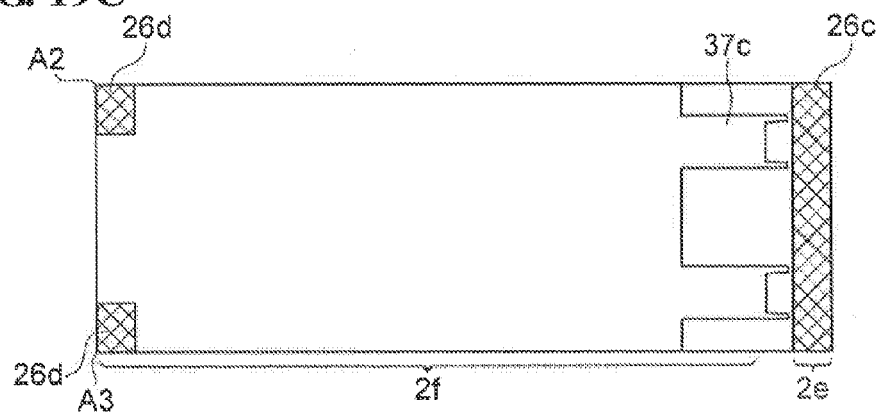

As shown in FIG. 18, the semiconductor light-receiving device 1C has the back electrode 26P instead of a back electrode 26. The back electrode 26P includes a first back electrode portion 26c and a second back electrode portion 26d. The first back electrode portion 26c is formed in a first region 2e where the via electrode 22 is formed in the substrate 16 and on the back surface 16b of the substrate 16. The first back electrode portion 26c is integral with the via electrode 22. The first back electrode portion 26c is electrically connected to a ground layer 2c of the mount board 2. The second back electrode portion 26d is formed in a second region 2f where the light-receiving element 18 and the optical waveguide 17 are formed on the substrate 16 and on the back surface 16b of the substrate 16. The first back electrode portion 26c and the second back electrode portion 26d are electrically isolated from each other. In the embodiment, the first back electrode portion 26c is disposed at an edge (first edge) of the substrate. The second back electrode portion 26d is disposed at another edge (second edge) of the substrate opposite to the first edge of the substrate as shown in FIGS. 19A, 19B, and 19C. The second back electrode portion 26d serves as a supporting portion that supports the light-receiving element 18 and the optical waveguide 17 and is electrically insulated. A ground layer 2d of the mount board 2 connected to the second back electrode portion 26d is electrically insulated from the ground layer 2c connected to the first back electrode portion 26c.

The first back electrode portion 26c and the second back electrode portion 26d are formed by selectively plating an electrode formed on the entire back surface 16b of the substrate 16 and then removing the seed metal by an ion milling method, for example.

The O/E converters 9A to 9D of the semiconductor light-receiving device 1C are grounded through the via electrodes 22. Thus, as with the light-receiving device 1A, the operation frequency is increased.

In the semiconductor light-receiving device 1C, the second back electrode portion 26d formed on the back surface 16b of the substrate 16 in the second region 2f where the light-receiving element 18 and the optical waveguide 17 are formed is electrically insulated. Accordingly, paths that would affect electrical signals generated in the light-receiving element 18 will not be generated even when the light-receiving elements 18 and the optical waveguides 17 share the n-type buffer layer 37C on the front surface 16a of the substrate 16. In other words, the current flowing through the parasitic capacitance C is suppressed and the voltage drop of the paths flowing through the parasitic capacitance is decreased. As a result, the voltage fluctuation in the n-type buffer layer 37C of other light-receiving elements 18 is suppressed. Therefore, the problem of cross-talk between the light-receiving elements 18 is alleviated.

The structure of the light-receiving device of the present invention is not limited to the structures of the light-receiving devices 1A to 1C of the embodiments.

For example, the back electrode 26P of the semiconductor light-receiving device 1C according to the third embodiment may have any shape such as those shown in FIGS. 19A to 19C. FIGS. 19A to 19C are diagrams illustrating modification examples of the back electrode 26P. The back electrode 26P shown in FIG. 19A includes a first back electrode portion 26c on the first region 2e and a second back electrode portion 26d on the second region 2f. The back electrode 26P is not formed on a region 2j sandwiched between the first region 2e and the second region 2f. According to this structure, the parasitic capacitance C is eliminated. Alternatively, as shown in FIG. 19B, the second back electrode portion 26d may be formed in a part of the second region 2f. In this case, the second back electrode portion 26d has a band shape extending along an edge A1 on the input ports 11a and 11b side of the optical-to-electrical converter chip 3A. According to this structure, the parasitic capacitance is also eliminated. Moreover, the opposing area between the n-type buffer layer 37C and the second back electrode portion 26d is decreased. Thus, magnitude of the parasitic capacitance C is decreased. Alternatively, as shown in FIG. 19C, the second back electrode portion 26d may be formed in parts of the second region 2f. In this case, the second back electrode portion 26d is arranged at corners A2 and A3 on the input ports 11a and 11b side of the optical-to-electrical converter chip 3A. According to this structure, the parasitic capacitance C is eliminated. Since the opposing area between the n-type buffer layer 37C and the second back electrode portion 26d is further decreased, magnitude of the parasitic capacitance C is further decreased.

The optical waveguide core layer 28 in the first to third embodiments may be formed by using an AlGaInSb-based semiconductor material.

The p-type semiconductor materials used in the first to third embodiment may be n-type semiconductor materials and the n-type semiconductor materials used in the first to third embodiment may be p-type semiconductor materials.

A capacitance element, a resistance element, an InP-based electronic device such as a heterojunction bipolar transistor, and the like may be formed on the substrate 16 composed of InP so as to form an optical-to-electrical converter circuit in the optical-to-electrical converter chip 3A.

EXAMPLES

Examples of the light-receiving device according to the present invention will now be described. A light-receiving device according to Example 1, which corresponds to the semiconductor light-receiving device 1B described above, and a light-receiving device of Comparative Example 1, and a light-receiving device of Comparative Example 2 are prepared and the resonance frequency of each device is examined.

Figure 20:
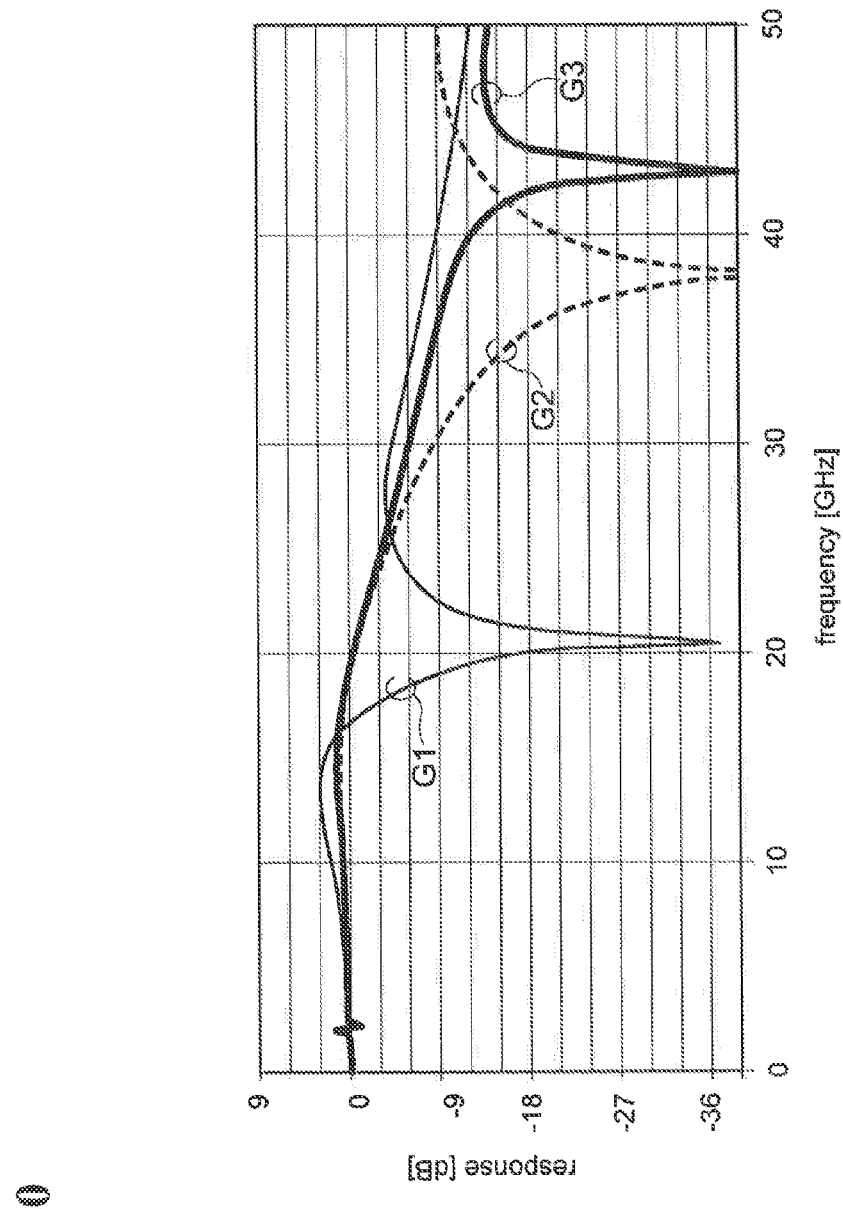
FIG. 20 is a graph showing results of Comparative Example 1, Comparative Example 2, and Example 1.

The light-receiving device of Comparative Example 1 corresponds to the light-receiving device 100 shown in FIG. 21. The length of the bonding wire 104 is 600 nm and the thickness of the substrate 16 is 100 nm. In Comparative Example 1, the frequency characteristics of a circuit that includes the bonding wire 56, the bias voltage-side electrode pad 21, the line 53, the capacitance element 19, the line 54, the reference potential-side electrode pad 55, the bonding wire 104, and the reference potential-side electrode pad 13c are measured to obtain magnitude of resonance frequency. Electrical signals are input through the bonding wire 56 while changing the frequency of the electrical signals from 0 Hz to 50 GHz. Then the electrical signals are retrieved from a reference potential-side electrode pad 103 of the signal amplifier 102, and the intensities are compared between the input signal and the output signal for every frequency, thereby measuring the frequency characteristics of the circuit. FIG. 20 is a graph showing the frequency characteristics of the circuit. In FIG. 20, the vertical axis indicates the gain of the output signal relative to the input signal and the horizontal axis indicates the frequency of the input signals. The graph G1 in FIG. 20 shows the frequency characteristic of the circuit in Comparative Example 1. The graph shows that a resonance frequency F1 is present at about 21 GHz in the circuit configuration of Comparative Example 1.

The light-receiving device of Comparative Example 2 is identical to the light-receiving device of Comparative Example 1 except that a structure having the reduced inductance component and the reduced capacitance component is employed. In particular, the length of the bonding wire 104 is halved (300 nm) from the length of the bonding wire 104 in Comparative Example 1 in order to decrease the inductance component. The thickness of the substrate 16 is tripled (300 nm) from the thickness of the substrate 16 of Comparative Example 1 in order to decrease the capacitance component. The graph G2 in FIG. 20 shows the frequency characteristic of the circuit in Comparative Example 2. The graph shows that resonance frequency F2 is present at about 38 GHz in the circuit configuration of Comparative Example 2. It should be noted here that the light-receiving device of Comparative Example 2 is capable of high-speed operation at a bit rate of 40 Gbps. However, work of connecting the bonding wire 104 and processing the substrate 16 may become difficult.

As mentioned earlier, the light-receiving device of Example 1 corresponds to the semiconductor light-receiving device 1B of the second embodiment. The graph G3 of FIG. 20 indicates the frequency characteristic of the circuit of Example 1. The graph shows that a resonance frequency F3 is present at about 43 GHz according to the circuit configuration of the semiconductor light-receiving device 1B. This value of the resonance frequency is sufficiently larger than the frequency band (30 GHz) required for high-speed operation of the semiconductor light-receiving device 1B at a bit rate of 40 Gbps. Moreover, the work of connecting bonding wires is not needed and the workability of the substrate 16 is not impaired. Thus, the semiconductor light-receiving device 1B is miniaturized by using the via electrodes 22 that provides the reference potential to the O/E converters 9A to 9D and the back electrode 26B not having portions facing the bonding pads, lines, etc., and mass-productivity is improved without impairing ease of production of the semiconductor light-receiving device 1B. The operation frequency of the semiconductor light-receiving device 1B is also increased.

Principles of the present invention have been described on the basis of preferred embodiments with reference to the drawings. However, those skilled in the art will understand that the embodiments can be changed in terms of details without departing from the principles. Therefore, all the modifications and changes within the scope and the spirit of Claims are claimed as the present invention.

What is claimed is:

1. An optical-to-electrical converter unit comprising:
a substrate having a front surface and a back surface;
an optical waveguide unit; and
at least one optical-to-electrical converter,
wherein the optical-to-electrical converter includes:
a light-receiving element including an optical absorption layer, a first electrode, and a second electrode, the light-receiving element being optically coupled to the optical waveguide unit;
a capacitance element including a first conductive layer, a second conductive layer, and an insulating layer disposed between the first conductive layer and the second conductive layer;
a first electrode pad electrically connected to the first electrode of the light-receiving element for supplying a bias voltage to the light-receiving element;
a second electrode pad electrically connected to the second electrode of the light-receiving element;
a back electrode formed on the back surface of the substrate; and
a via electrode extending from the front surface to the back surface of the substrate, the via electrode connecting the capacitance element to the back electrode, and
wherein the optical waveguide unit, the light-receiving element, the capacitance element, the first electrode pad, and the second electrode pad are formed on the front surface of the substrate,
the first conductive layer of the capacitance element is electrically connected to the first electrode of the light-receiving element and the first electrode pad, and
the second conductive layer of the capacitance element is electrically connected to the back electrode through the via electrode.

2. The optical-to-electrical converter unit according to claim 1, wherein the via electrode includes a pillar extending in a thickness direction of the substrate,
the via electrode fills a via hole penetrating through the substrate in the thickness direction with the pillar, and
the via electrode is integrated with the back electrode.

3. The optical-to-electrical converter unit according to claim 1, wherein the substrate includes a first region where the via electrode is formed and a second region where the light-receiving element and the optical waveguide unit are formed,
the back electrode includes a first back electrode portion formed in the first region and a second back electrode portion formed in the second region,
the first back electrode portion is electrically connected to the via electrode, and
the first back electrode portion and the second back electrode portion are electrically isolated from each other.

4. The optical-to-electrical converter unit according to claim 3, wherein the first back electrode portion is disposed at a first edge of the substrate, and
the second back electrode portion is disposed at a second edge of the substrate opposite to the first edge of the substrate.

5. The optical-to-electrical converter unit according to claim 1, wherein the insulating layer of the capacitance element is composed of a dielectric film including a SiN film, a SiON film, or a $SiO_2$ film.

6. A semiconductor light-receiving device comprising:
a mount board having a ground layer;
an optical-to-electrical converter unit disposed on the ground layer of the mount board; and
a signal amplifier disposed on the ground layer of the mount board, the signal amplifier amplifying an electrical signal output from the optical-to-electrical converter,
wherein the optical-to-electrical converter unit includes:
a substrate having a front surface and a back surface;
an optical waveguide unit; and
an optical-to-electrical converter,
wherein the optical-to-electrical converter includes:
a light-receiving element including an optical absorption layer, a first electrode, and a second electrode, the light-receiving element being optically coupled to the optical waveguide unit;
a capacitance element including a first conductive layer, a second conductive layer, and an insulating layer disposed between the first conductive layer and the second conductive layer;
a first electrode pad electrically connected to the first electrode of the light-receiving element for supplying a bias voltage to the light-receiving element;
a second electrode pad electrically connected to the second electrode, the second electrode pad being electrically connected to a signal input electrode pad of the signal amplifier;
a back electrode disposed on the back surface of the substrate, the back electrode being in contact with the ground layer of the mount board; and
a via electrode extending from the front surface to the back surface of the substrate, the via electrode connecting the capacitance element to the back electrode, and
wherein the optical waveguide unit, the light-receiving element, the capacitance element, the first electrode pad, and the second electrode pad are formed on the front surface of the substrate,
the first conductive layer of the capacitance element is electrically connected to the first electrode of the light-receiving element and the first electrode pad, and
the second conductive layer of the capacitance element is electrically connected to the back electrode through the via electrode.

7. The semiconductor light-receiving device according to claim 6, wherein the substrate includes a first region where the via electrode is formed and a second region where the light-receiving element and the optical waveguide unit are formed,
the back electrode includes a first back electrode portion formed in the first region and a second back electrode portion formed in the second region,
the first back electrode portion is electrically connected to the via electrode,
the first back electrode portion and the second back electrode portion are electrically isolated from each other, and
the second back electrode portion is electrically insulated from the ground layer of the mount board.

8. The semiconductor light-receiving device according to claim 6,
wherein the optical-to-electrical converter unit includes plural optical-to-electrical converters, wherein the semiconductor light-receiving device includes plural signal amplifiers, and wherein the signal amplifiers are adjacent to the optical-to-electrical converters in a waveguiding direction.

* * * * *